United States Patent [19]

Witek

[11] Patent Number: 5,705,409
[45] Date of Patent: Jan. 6, 1998

[54] METHOD FOR FORMING TRENCH TRANSISTOR STRUCTURE

[75] Inventor: Keith E. Witek, Austin, Tex.

[73] Assignee: Motorola Inc., Schaumburg, Ill.

[21] Appl. No.: 535,397

[22] Filed: Sep. 28, 1995

[51] Int. Cl.⁶ ................................................ H01L 21/265
[52] U.S. Cl. ............................. 437/35; 437/34; 437/52; 437/56; 437/90; 437/915
[58] Field of Search ........................... 437/34, 52, 56, 437/57, 58, 90, 915

[56] References Cited

U.S. PATENT DOCUMENTS

| | | | |
|---|---|---|---|
| 4,554,570 | 11/1985 | Jastrzebski et al. | 357/23.4 |
| 4,740,826 | 4/1988 | Chatterjee | 357/42 |
| 4,757,029 | 7/1988 | Koury, Jr. | 437/90 |
| 4,890,144 | 12/1989 | Teng et al. | 357/23.4 |
| 4,974,060 | 11/1990 | Ogasawara | 357/23.6 |
| 4,982,266 | 1/1991 | Chatterjee | 357/71 |
| 5,010,386 | 4/1991 | Groover, III | 357/42 |
| 5,122,848 | 6/1992 | Lee et al. | 357/23.6 |
| 5,140,388 | 8/1992 | Bartelink | 357/23.4 |
| 5,158,901 | 10/1992 | Kosa et al. | 437/40 |
| 5,285,093 | 2/1994 | Lage et al. | 257/332 |
| 5,302,846 | 4/1994 | Matsumoto | 257/329 |
| 5,308,778 | 5/1994 | Fitch et al. | 437/56 |
| 5,308,782 | 5/1994 | Mazure et al. | 437/57 |
| 5,324,673 | 6/1994 | Fitch et al. | 437/40 |
| 5,398,200 | 3/1995 | Mazure et al. | 365/174 |
| 5,408,130 | 4/1995 | Woo et al. | 257/758 |

OTHER PUBLICATIONS

"High Performance Characteristics in Trench Dual-Gate MOSFET (TDMOS)," Mizuno et al; IEEE Transactions on Electron Devices, Sep. 1991.

"Impact of Surrounding Gate Transistor (SGT) for Ultra-High-Density LSI's," Takato et al; IEEE Transactions on Electron Devices, vol. 38, No. 3, Mar. 1991.

Primary Examiner—Jey Tsai
Assistant Examiner—Long Pham
Attorney, Agent, or Firm—Keith E. Witek

[57] ABSTRACT

A method for forming a trench transistor structure begins by forming a buried layers (12 and 16) and a doped well (22) in a substrate (10) via epitaxial growth processing. A trench region (24) is then etched into the substrate (10) to expose a the layer (12). A conductive sidewall spacer (28) is formed within the trench (24) as a gate electrode. The spacer (28) gates a first transistor (12, 28, 32) located adjacent a first half of the trench (24) and a second transistor (12, 28, 34) located adjacent a second half of the trench (24). Region (12) is a common electrode wherein the channel regions of both the first and second transistor are coupled in a serial manner through the region (12).

48 Claims, 21 Drawing Sheets

METHOD FOR FORMING TRENCH TRANSISTOR STRUCTURE

FIELD OF THE INVENTION

The present invention relates generally to integrated circuit processing, and more particularly, to forming trench transistors and inverters.

BACKGROUND OF THE INVENTION

Semiconductor transistors formed on an integrated circuit are continuing to decrease is size. However, planar transistors which comprise a first current electrode laterally adjacent a channel region and a second current electrode laterally adjacent the channel region wherein the channel region separates the first and second current electrodes consume a significant amount of substrate space per transistor. Therefore, a significant amount of area that is consumed on an integrated circuit substrate is due to the planar or horizontal formation of transistors.

Today's integrated circuits are formed having millions of transistors and memory cells are formed such that millions of memory cells can be placed on a single integrated circuit. However, using planar transistors, the number of transistors that can be placed on a single integrated circuit is limited. It is now possible to form vertical transistors which generally take up less surface area than a planar transistor. However, vertical transistors are more difficult to form and may be difficult to contact/interconnect into the form of logic devices or memory cells in a small and acceptable area. Therefore, the need exists for new vertically formed trench transistors which have a smaller substrate footprint, are more manufacturable, and allow for the formation of more dense integrated circuits and memory cells.

Figure 1:
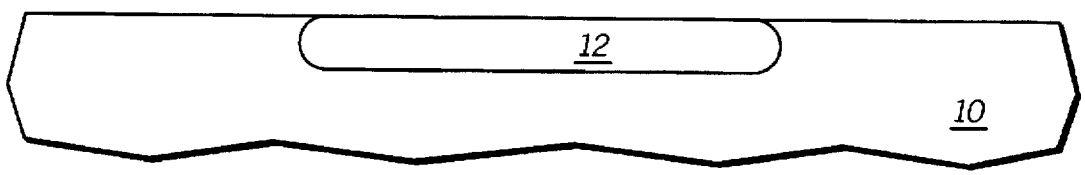
FIGS. 1–9 illustrate, in cross-sectional diagrams, a method for forming both a vertical P-channel transistor and a vertical N-channel transistor from a single trench in accordance with the present invention.

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

DESCRIPTION OF A PREFERRED EMBODIMENT

FIG. 1 illustrates a P-type silicon substrate 10. Other potential substrate materials include but are not limited to P-type or N-type silicon, gallium arsenide, silicon on sapphire, epitaxial formations, germanium, germanium silicon, polysilicon, silicon on insulator substrates, wafer-bonded substrates, and/or like substrate materials. A masking layer and a mask developing step (not illustrated in FIG. 1 and usually involving known photoresist processing) is used to mask an ion implantation. This ion implantation step is used to form an N-region 12 in FIG. 1 as a diffusion region. The P-type substrate is typically doped with a P-dopant, such as boron, so that the doping concentration of the substrate 10 is somewhere within a range of $10^{13}$ to $10^{15}$ dopant atoms per cubic centimeter. The N-region 12 is doped, preferably with antimony or arsenic to a doping concentration of roughly $10^{17}$ to $10^{21}$ dopant atoms per cubic centimeter. Antimony and arsenic are preferred for the formation of the N-region 12 since these atoms will defuse less than a phosphorous N dopant given the same amount of heat and same exposure time to the heat. A sacrificial implant oxide can also be formed over the substrate 10 and the region 12 either prior to formation of the region 12 or after formation of the region 12. These optional dielectric layers are not illustrated in FIG. 1.

After formation of the region 12, all dielectric layers or masking layers are removed from overlying the substrate 10 resulting in the device illustrated in FIG. 1. Typically, any dielectric such as air, wet or dry thermal oxide, silicon nitride, nitrided oxide, fluorinated oxide, oxynitride, polyoxide, a chemical vapor deposition (CVD) film, a plasma enhanced chemical vapor deposition (PECVD) film, a low pressure chemical vapor deposition (LPCVD) film, a high temperature oxide (HTO) film, a tetraethylorthosilicate (TEOS) based oxide, a polyimide film, a borophosphosilicate glass (BPSG) film, a phosphosilicate glass (PSG) film, germanium oxide, or like dielectric materials may be used for dielectric layers as taught herein.

Figure 2:
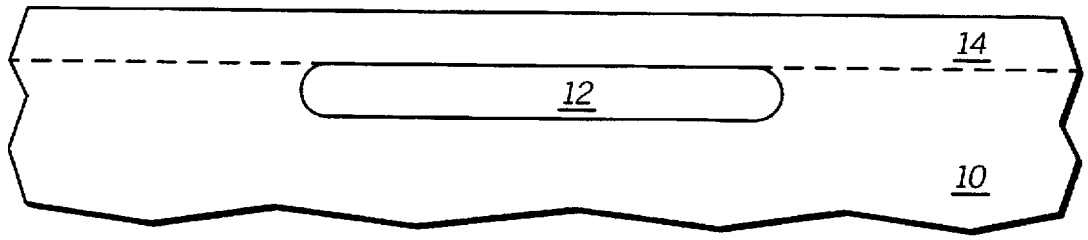
Figure 36:
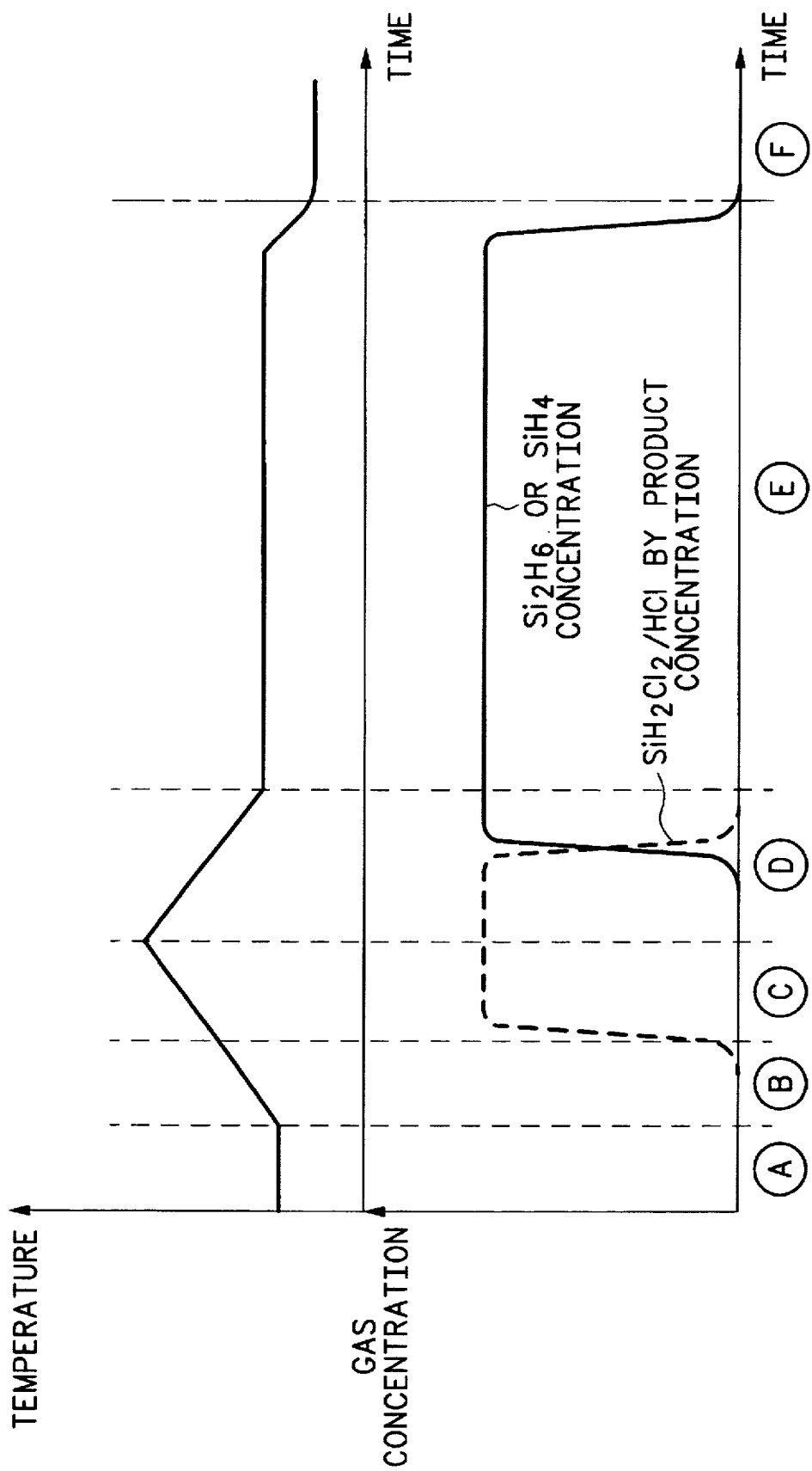
FIG. 36 illustrates, in an X–Y plot, a method for growing an epitaxial layer of material to form a buried layer in accordance with the present invention.

In FIG. 2, the surface of the substrate and the surface of the doped region 12 are optionally cleaned via an RCA clean or a like process and exposed to an epitaxial process environment. The epitaxial process will grow an epitaxial layer of silicon 14 on top of the region 12 and the substrate 10. Subsequent to FIG. 2, the substrate 10 will be referred to as both region 10 of FIG. 1 and region 14 of FIG. 2 since both the regions 10 and 14 are of a similar or identical substrate material. In many cases, it would be difficult to distinguish region 14 from region 10 or find the boundary therebetween. A typical process used to manufacture the region 14 is a two step epi-process or, in the alternative, the novel process of FIG. 36 discussed below. The process of FIG. 36 is taught in detail later in this text while the two-step process is taught here. The two step epi-process first uses a high temperature 1150° C. low pressure (10 Torr) $SiH_2Cl_2$ epitaxial substrate exposure. This first exposure is followed by a low temperature 900° C. low pressure (10 Torr) $SiH_4$ epitaxial exposure. The thickness of epi-layer 14 is relatively thin and is typically on the order of a few hundred angstroms. By growing the region 14 the region 12 becomes an N-type buried layer 12. A dashed line is used to delineate region 14 from substrate 10 in FIG. 2 since the epitaxial region 14 is nearly indistinguishable from the substrate 10 since both region 14 and substrate 10 are single crystalline silicon material.

Figure 3:
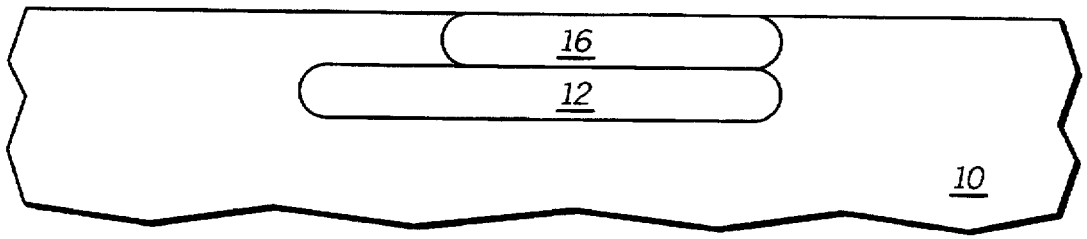

FIG. 3 illustrates that a P-type region is ion implanted into a masked portion of the substrate 10 (previously referred to as region 14). P-region 16 is formed in a manner similar to region 12 but is doped with boron or a like P-type dopant atom. The doping concentration of P-region 16 is typically within the range of $10^{17}$ to $10^{21}$ atoms per centimeter cubed. The region 16 is preferably formed having a width less than the width of region 12 as illustrated in FIG. 3. Region 12 and region 16 abut one another to form a PN junction.

Figure 4:
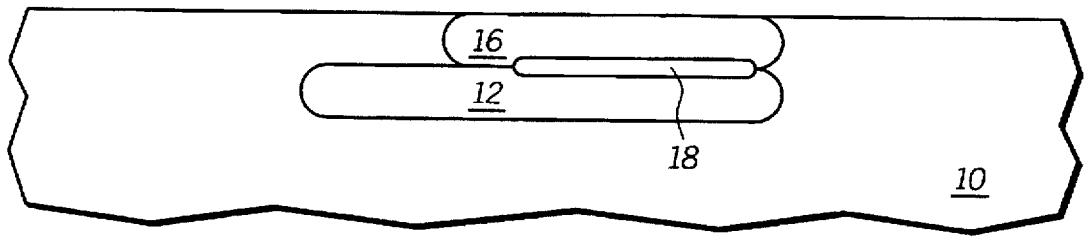

FIG. 4 illustrates an optional step wherein a silicided refractory metal region 18 is implanted into the boundary between the P-region 16 and the N-region 12. Region 18 is formed to reduce any diode voltage drop occurring across the PN junction formed by regions 12 and regions 16. In an alternate form, the effects of the PN junction can be reduced by grading the dopant change over distance at the interface of region 16 and region 12. Region 18 is optional and the grading of the junctions between region 12 and region 16 is also an option that will render region 18 not needed. Therefore, the optional silicide/metal region 18 is not further illustrated in subsequent figures.

Figure 5:
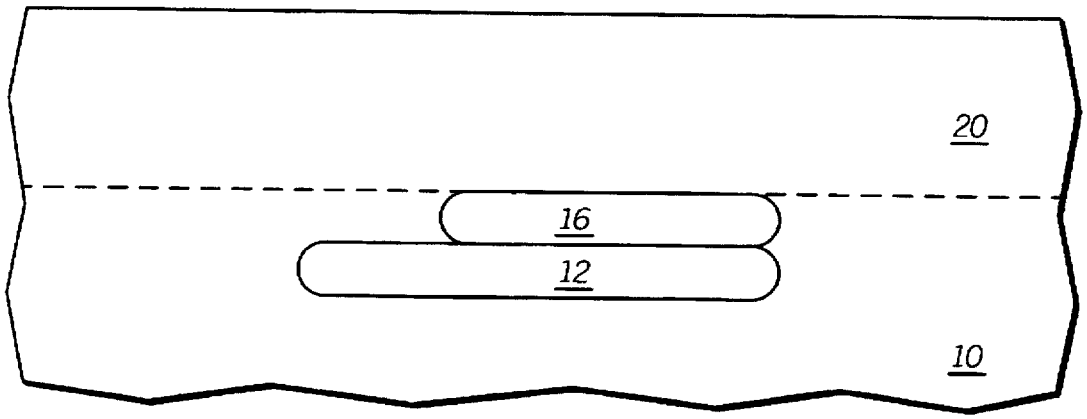

In FIG. 5, an blanket intrinsic epitaxial silicon layer 20 is formed over the P-region 16 rendering both the P-region 16 and N-region 12 buried layers. Region 12 is doped P-type in a manner similar to region 14 of FIG. 2 and is typically formed having a thickness of roughly several hundred angstroms to one micron. P-type doping of region 20 can be performed in-situ to the growth of region 20 or can be performed via P-well processing. The process used to form region 20 is similar to the process described with respect to FIG. 2 or can be any intrinsic epi-process. Since the region 20 is epitaxial silicon, region 20 should be relatively indistinguishable from the substrate 10 and from the region 14 in FIG. 2. Therefore, as in FIG. 2, region 20 will hereafter be referred to as part of the substrate 10.

Figure 6:
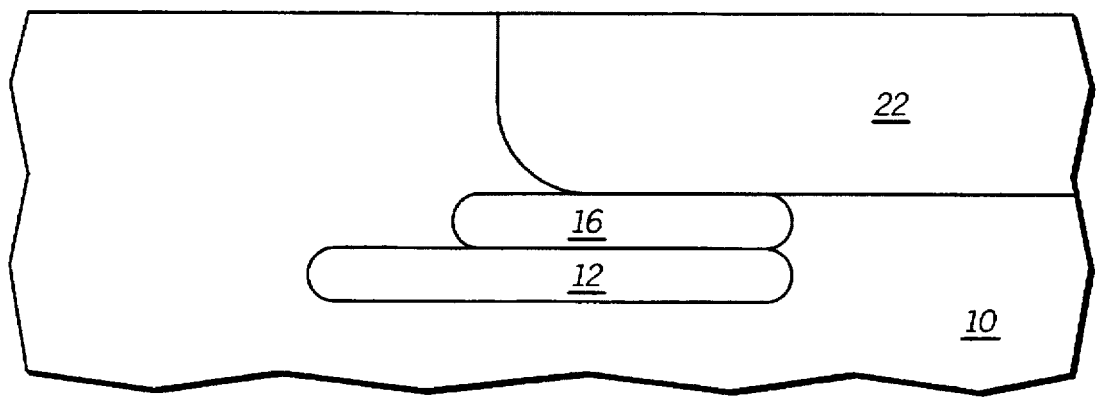

In FIG. 6 a deep phosphorous implant and a drive-in/ anneal step are used to form a well region 22 having an N-type doping concentration. Phosphorous is used for the N-well region to allow for driving and proper situation of the N-well without substantially or adversely driving the doped regions 12 and 16. The N-well 22 may also be formed by trench etch, polysilicon plug, and recrystallization techniques which are known in the bipolar industry. Typically, the doping of the N-well region 22 is at least an order of magnitude higher than the doping concentration of the P-region 20 in FIG. 5. Therefore, if the P-region 20 is doped to $10^{15}$ boron atoms per centimeter cubed, the N-well 22 is doped to around $10^{16}$ phosphorous atoms per centimeter cubed. In order to form N-well 22, it may be advantageous to perform several phosphorous implants at different energy levels.

Figure 7:
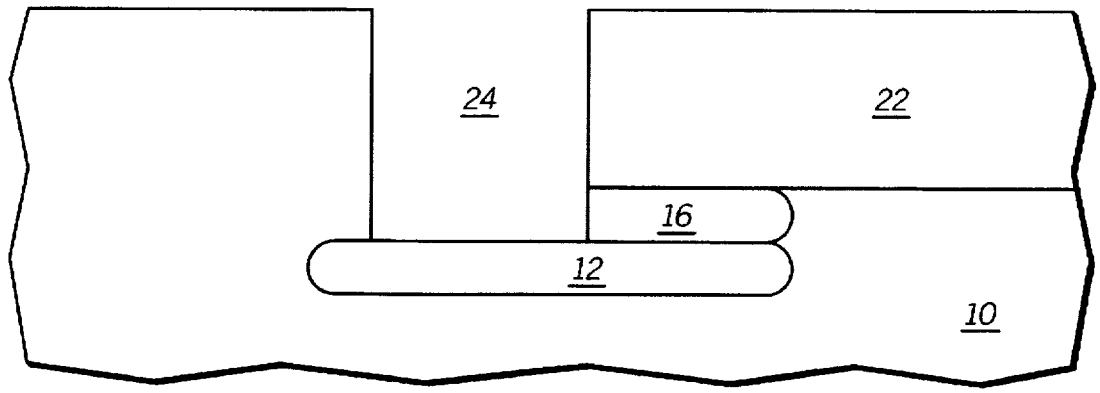

FIG. 7 illustrates that a trench region 24 is formed through a portion of the N-well 22 and a portion of the P-region 16 to expose a portion of the N-region 12. The slopes of trench region 24 are slightly tapered when etched using a typical process and the bottom corners of the trench region 24 are typically curved/rounded and less pointed. In order to etch region 24, a masking layer (not illustrated in FIG. 7) is formed overlying the well region 22 and the substrate 10 wherein the etch chemistry used to etch region 24 should not substantially etch the masking layer. Initially, before forming the depth of the trench 24, native oxide is removed off the surface of the exposed region of well 22 and the substrate 10. A typical chemistry that can be used to etch the trench region 24 are chlorine based chemistries such as $BCl_3/Cl_2$, $H_2/Cl_2/SiCl_4$, and $CHCO_3/O_2/N_2$. In addition, reactive ion etch (RIE) etch processing is typically used. In other embodiments, a fluorinated chemistry such $CF_4$ or $SF_6$ may be used and in addition, a polymer depositing etchant species may also be added to the etch mixture to protect sidewalls of the trench region 24. One sidewall protecting species is known to be $CHF_3$. Trench region 24 can be formed using a timed non-selective etch or can be formed using a timed non-selective etch until region 22 is cleared and then reverting to an etch that is selective and stops/slows when exposed to N-type materials such as N-region 12.

Figure 8:
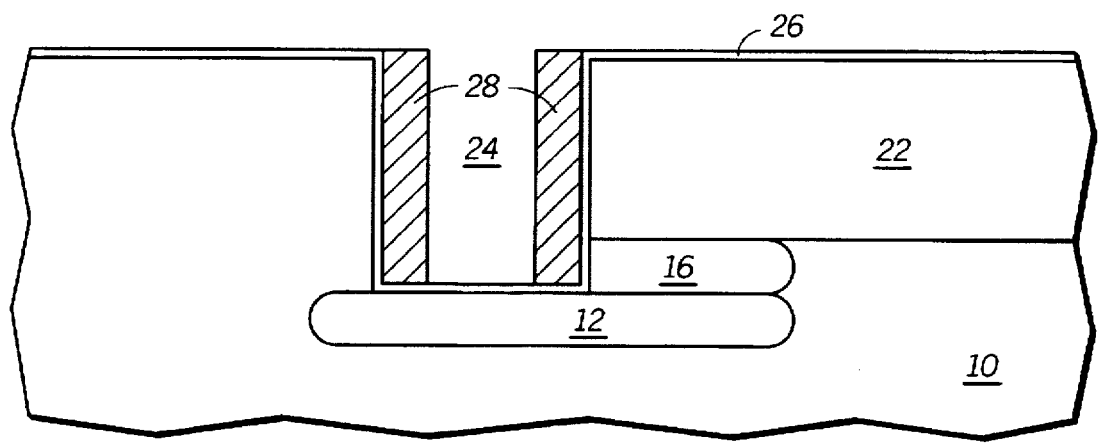

FIG. 8 illustrates that a gate dielectric region 26 is formed within the trench 24 and overlying a top surface of a substrate 10 and the N-well 22. Dielectric layer 26 may be formed by dielectric growth processing (a thermal layer) or dielectric layer 26 can be a composite dielectric layer comprising grown oxide and chemical vapor deposited (CVD) oxide. In addition, the gate oxide 26 may be exposed to nitrogen, fluorine, and/or chlorine to further increase the effectiveness and robustness of the oxide 26. After formation of the oxide or dielectric layer 26, a conductive sidewall spacer 28 is formed laterally adjacent a sidewall of the trench 24. Spacer 28 is typically formed of a polysilicon or amorphous silicon material, but may be any conductive material capable of spacer formation. The material used to form spacer 28 can either be insitu doped during deposition or be ion implanted after deposition but before spacer etching to be one of either N-type or P-type. In another form, half of the spacer 28 which is annular in shape and surrounds a sidewall of the trench 24 can be formed being P-type while another half of the spacer 28 can be formed being N-type even though dopants in polysilicon diffuse much faster than in single crystalline silicon. The sidewall spacer can also be selectively silicided or salicided. A masking region is used to form a tab region off of spacer 28 so that spacer 28 is later top-down contacted by a via or contact opening. The tab region 28a of spacer 28 is illustrated in FIG. 10, wherein FIG. 10 is a top down illustration of the final device cross-section FIG. 9.

Figure 9:
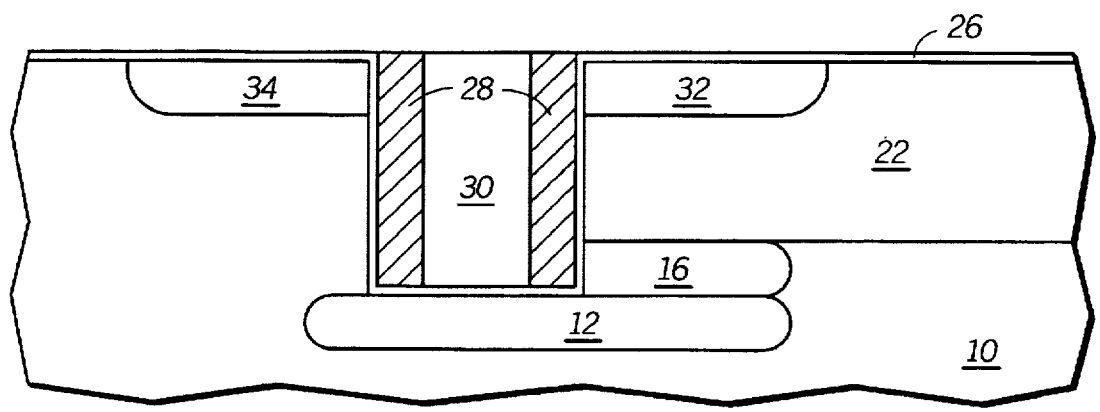

In FIG. 9, a dielectric plug region 30 is formed around an inner-circumference of the annular spacer 28 of FIG. 8. The plug region 30 is preferably formed via deposition and etch back or chemical mechanical polishing (CMP) processing. An optional etch stop layer may be formed above the substrate 10 and around the trench region 30 by forming the etch/polish stop region before the formation of the trench. Once plug region 30 is formed, a first mask and implant operation is used to form a P-region 32 and a second mask and implant operation is used to form an N-region 34 as illustrated. Therefore, FIG. 9 illustrates two transistors, one transistor being P-channel and another transistor being N-channel, which are serially coupled together via the connection of regions 12 and 16 and gated by a single gate electrode 28. A first transistor which is N-channel has a current electrode 12 and a second current electrode 34 wherein a channel region separates the region 12 and region 34 at a left sidewall of the trench 24 in FIG. 9. A second transistor which is a P-channel transistor is formed to the right of FIG. 9 and has current electrodes 16 and 32 wherein a channel region is illustrated between regions 16 and 32 adjacent a right-most portion of the trench region 24. Therefore, the current flow of both the N-channel and P-channel transistor illustrated in FIG. 9 is vertical to a top surface of the substrate 10. Because region 16 is coupled to region 12, the N-channel and P-channel transistors of FIG. 9 are connected in series. It is important to note that field oxide isolation, trench isolation, or a like method of isolation is not illustrated in FIG. 9 for simplicity. However, dielectric isolation will be present in a manufactured device laterally adjacent the P-region 32, the trench region 24, and the N-region 34.

Figure 10:
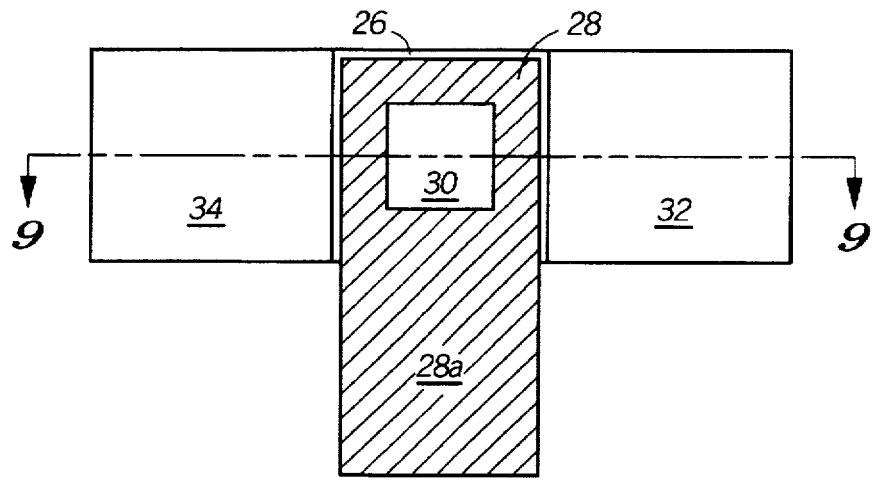
FIG. 10 illustrates, in a top perspective view, a top view of the device cross-sectioned in FIG. 9.

FIG. 10 illustrates a top perspective view of FIG. 9 wherein FIG. 9 is FIG. 10 cross-sectioned along the line 9. FIG. 10 illustrates the N-region 34 and the P-region 32 which are surrounded by field isolation. The trench region 24 is filled in FIG. 10 via the gate dielectric 26, the gate electrode spacer 28, and the plug region 30 wherein the trench region is also surrounded by isolation dielectric. The tab region 28a discussed in reference to FIG. 8 is illustrated in FIG. 10 and preferably overlies the isolation laterally adjacent the trench. In another form, contact may he made to the spacer directly over the region 30. However, the tab region 28a makes contact to the spacer gate electrode 28 easier to manufacture.

Figure 11:
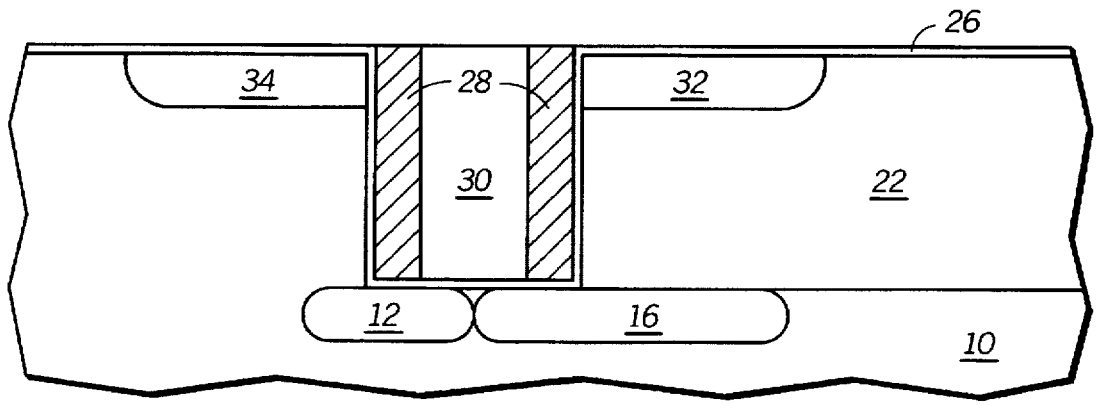
FIG. 11 illustrates, in a cross-sectional diagram, an alternate embodiment to FIG. 9 which is in accordance with the present invention.

FIG. 11 illustrates that the P-region 16 and the N-region 12 formed in FIGS. 1–5 may be formed side by side with one another as illustrated in FIG. 11. In this form, the interface dopant grading or the silicided/refractory metal region 18 discussed earlier may also be used between the interface of region 12 and region 16 in FIG. 11. Therefore, the side-by-side PN configuration of FIG. 11 as opposed to the stacked configuration of FIG. 3 results in two possible embodiments of the N-channel/P-channel method taught via FIGS. 1–10.

Figure 12:
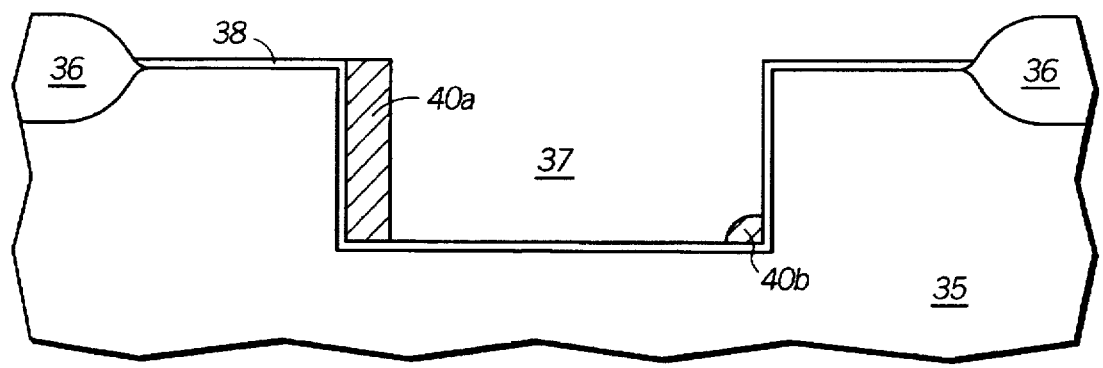
FIGS. 12–17 illustrate, in both cross-sectional diagrams and top perspective views, a process for forming a three transistor structure for use in making a random access memory cell in accordance with the present invention.

FIGS. 12–17 illustrate another embodiment which is used to form several transistors in a small substrate footprint. FIG. 12 illustrates a substrate 35 wherein a trench region 37 is etched within the substrate 35. The trench region 37 is formed in a manner similar to the trench region 24 of FIG. 7. After formation of the trench region 37, a dielectric layer 38 is formed along the sidewalls of the trench 37, the bottom of the trench 37, and a top portion of the substrate 35. FIG. 12 illustrates field oxide isolation regions 36. It is important to note that field oxide isolation as illustrated in FIG. 12 may be replaced by trench isolation or any other known isolation structure. A conductive layer is deposited and then reactive ion etched to form a spacer region 40a and 40b. Spacer region 40a and 40b are cylindrically coupled to each other around the circumference of the trench region 37. A height of the spacer portion 40a is higher than a height of the spacer portion 40b. This difference in height is created by masking region 40a while exposing region 40b to an etchant environment. In many cases, etch technology can be used to entirely remove region 40b from within the trench (i.e., the height of the region 40b will be zero in this case). In some circumstances, the etch technology used to etch away at region 40b is not sufficient to entirely remove all of the spacer material. In this case, a stringer, which is another name used for the reduced-height spacer 40b, is remaining in the trench 37 after the etch step is complete. This stringer does not cause any significant adverse effects to the subsequent processing of the integrated circuit (IC) as long as the spacer 40b is reduced significantly in height as illustrated in FIG. 12.

A dielectric layer 48 is formed over the spacers 40a and 40b. After formation of the dielectric layer 48 or before formation of the dielectric 48 a self-aligned ion implantation step is used to form doped regions 42, 44, and 46 which are self-aligned to the spacer region 40a and 40b. Doped regions 42, 44, and 46 are N-type as illustrated in FIG. 13, but may be created as P-type in another embodiment.

Figure 13:
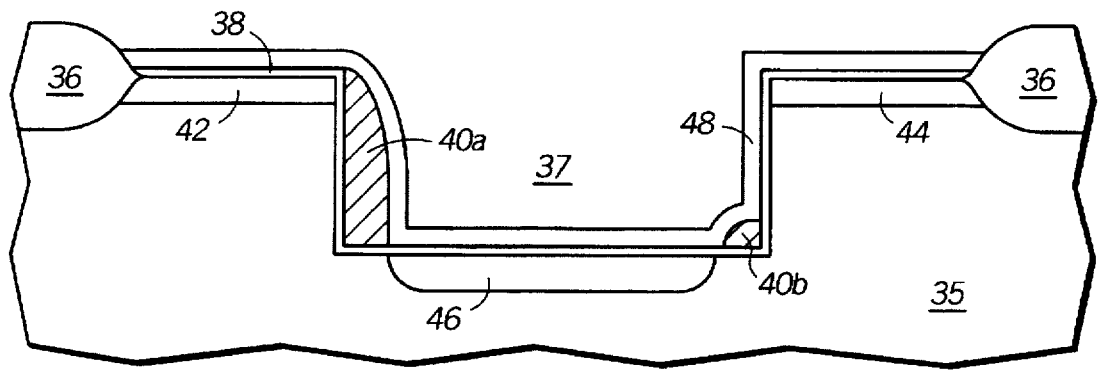
Figure 14:
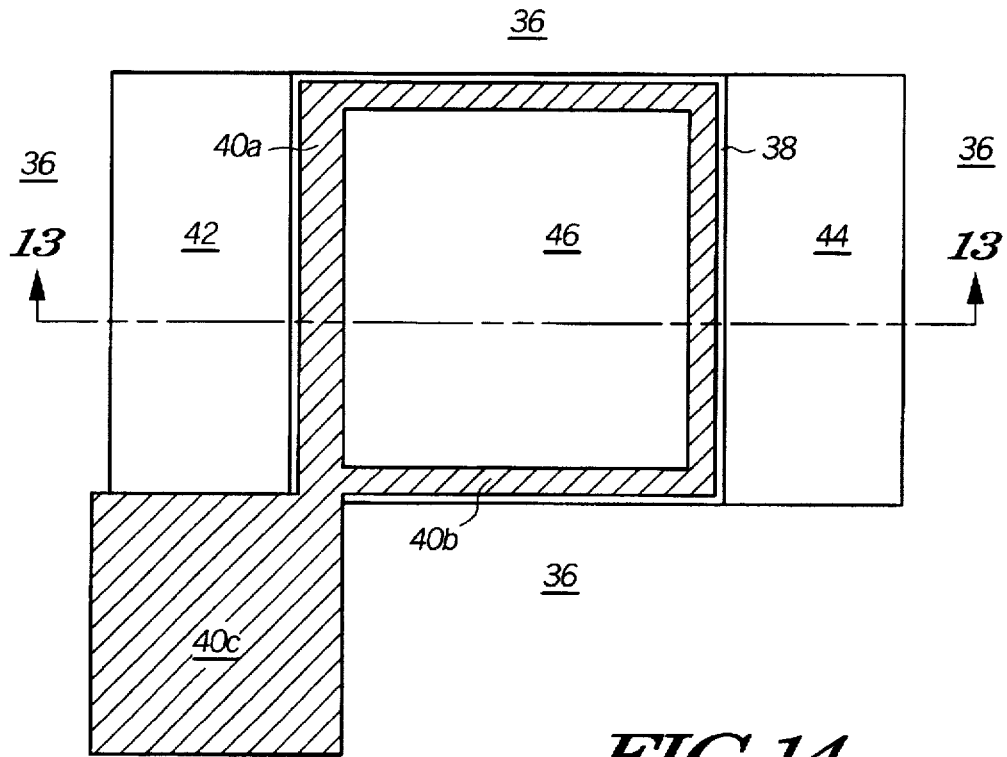

FIG. 14 illustrates a top perspective view of the structure of FIG. 13. FIG. 13 is FIG. 14 cross-sectioned along the line 13. FIG. 14 illustrates the field oxide layers 36, the doped region 42, 44, and 46, spacer 40a which is coupled to stringer or spacer portion 40b, and the gate dielectric layer 38. FIG. 14 illustrates that a masking layer is used when etching the spacer portion 40a to leave behind a region 40c adjacent to the doped region 42 and overlying the field oxide 36 wherein the tab region 40c is connected to the spacer region 40a. Tab region 40c is used since 40c can be more easily contacted by a top down connection than the spacer 40a.

Figure 15:
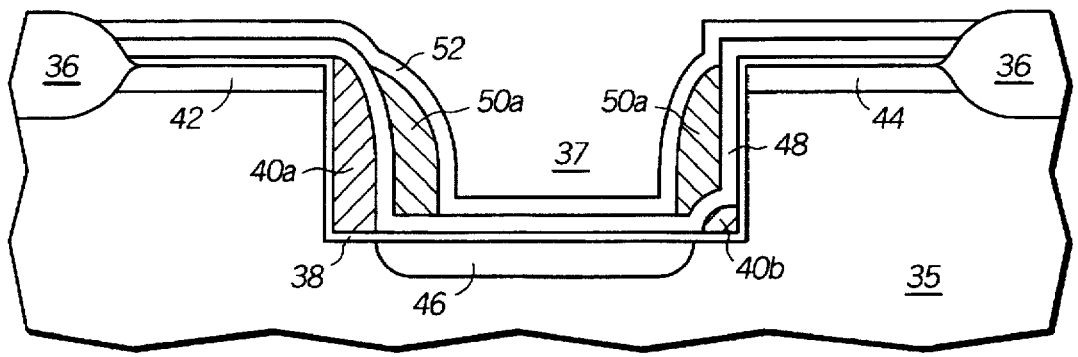

After formation of the dielectric layer 48, a second conductive spacer 50a is formed adjacent the spacer 40a. The spacer 50a completely surrounds an interior portion of the trench 37. After formation of the spacer 50a, a dielectric layer 54 is formed overlying the spacer 50a. FIG. 15 therefore illustrates two transistors. A first transistor has a channel region between the doped region 46 and the doped region 42 wherein this channel region is gated by spacer portion 40a. A gate voltage may be placed on the spacer 40a via a contact to region 40c illustrated in FIG. 14. The second spacer 50a gates a channel region located between region 46 and region 44. Due to the fact that both transistors in FIG. 15 share a common electrode 46, both the transistors are connected in a serial manner.

Figure 16:
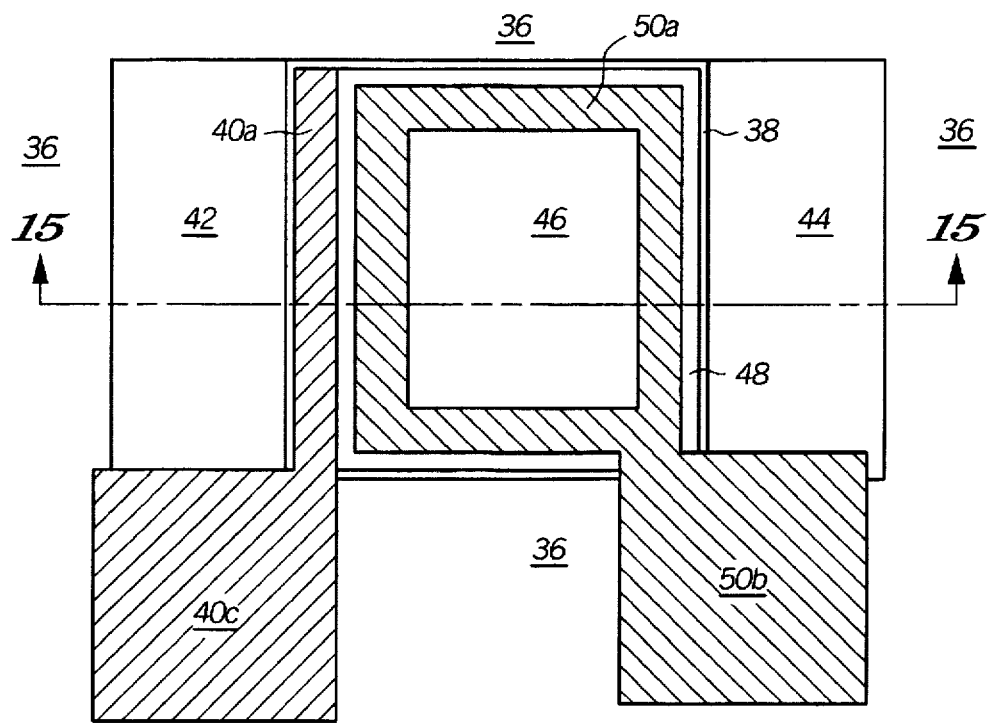

FIG. 16 illustrates the cross-section of FIG. 15 in a top down manner. FIG. 15 is FIG. 16 cross-sectioned along line 15. FIG. 16 illustrates the doped regions 42, 44, and 46, the dielectric layer 48, spacer 50a, spacer 40a, gate dielectric layer 38, and field oxide regions 36. In addition, FIG. 16 illustrates a tab region 50b which is coupled to the spacer 50a in a manner similar to the connection of region 40c to spacer 40a. Region 50b is used to provide an easily accessible conductive area through which spacer 50a can be electrically contacted.

Figure 17:
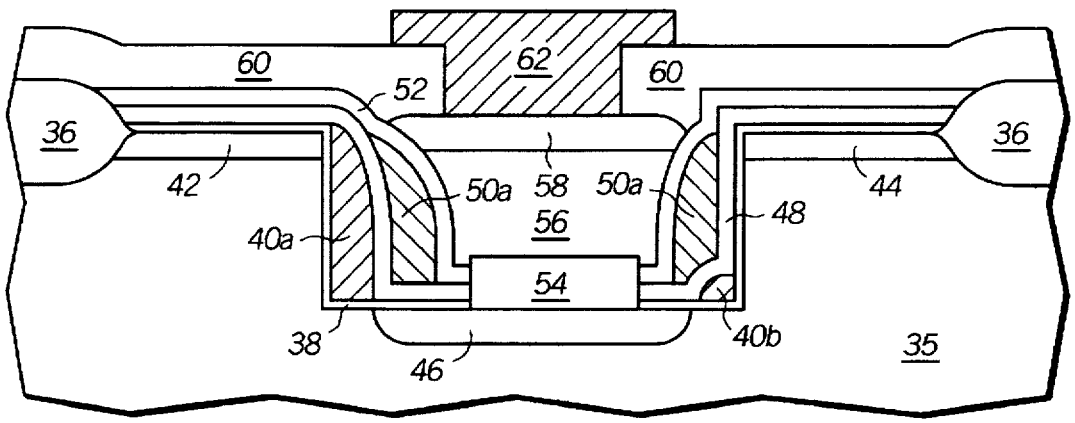

FIG. 17 illustrates that a masking and etch step is used to etch through dielectric layer 52, dielectric layer 48, and dielectric 38 in order to expose a portion of the doped region 46 which lies at the bottom of the trench 37. Once the opening which exposes the doped region 46 is formed, one of two methods can be performed to form the middle P-channel transistor illustrated in FIG. 17. A first method is to epitaxially grow P-region 54 from the doped region 46. After formation of region 54, an N-region 56 is expitaxial grown from the region 54. After growing N-type region 56, a P-region 58 may either be epitaxially grown or ion implanted into region 56.

In another form, an ion implant step can be used to form a P-region within the doped region 46. In this case, the P-region 54 will not overly region 46 but will be located within region 46 unlike that illustrated in FIG. 17. After this P-implant step to form a region 54 within the region 46, a polysilicon plug may be deposited and polished back to form region 56 having an N-type conductivity. An ion implant step may then be used to form the P-region 58 as illustrated in FIG. 17. This polysilicon region which comprises region 56 and 58 may be recrystallized to a certain extent or may be left as polysilicon since the P-channel transistor in FIG. 17 is likely to be used as a pull-up P-channel transistor for an SRAM cell. These pull-up transistors can typically have a larger resistance and off-current than other transistors while allowing the memory cell to function properly.

After forming the P-channel transistor in a central location of FIG. 17, the dielectric layer 60 is deposited over the P-channel transistor. An opening is etched through the layer 60 to expose a top portion of the P-region 58. A conductive layer 62 which is either polysilicon or metal, is then deposited into the opening formed through dielectric layer 60. Therefore, FIG. 17 illustrates a three transistor structure having two N-channel transistors as discussed with respect to FIGS. 15 and 16 and another P-channel transistor formed within the trench 37. This P-channel transistor is gated via the spacer 50a. The structure illustrated in FIG. 17 can be used to form very compact six-transistor SRAM cells. Contact to region 46 of FIG. 17 can be performed using a contact structure illustrated in FIG. 32 via opening Y or a contact illustrated in FIGS. 18-20. In another form, region 46 can be a buried layer extending out of the page of FIG. 17 and can be contacted to by a deep-collector-type contact used in bipolar design.

Figure 18:
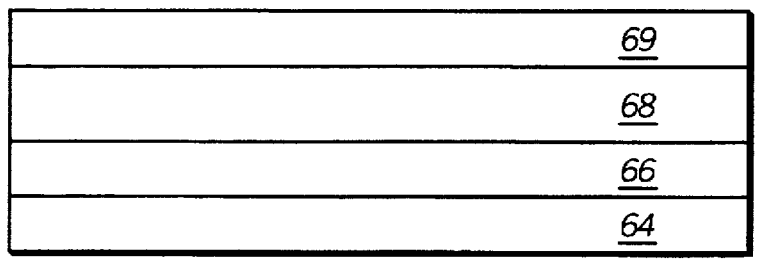
FIGS. 18–20 illustrate, in cross-sectional diagrams, a method for forming a contact for a vertical structure or a random access memory cell in accordance with the present invention.
Figure 19:
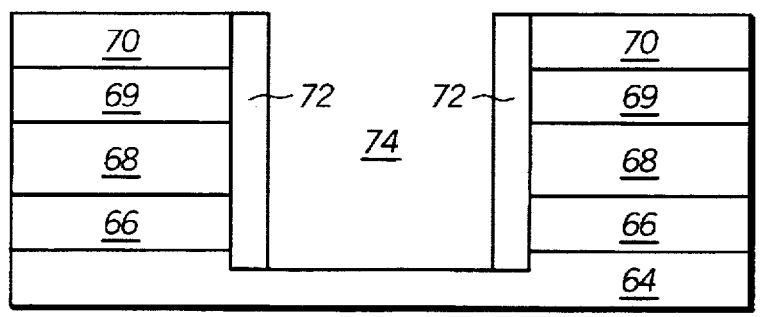
Figure 20:
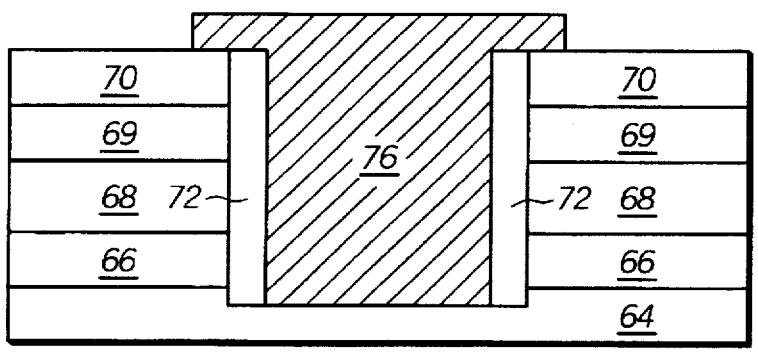

FIGS. 18-20 illustrate a method for contacting a buried layer formed deep within substrate material. FIG. 18 illustrates that an N-type buried layer 64 is formed via methods discussed in FIGS. 1-6. On top of N-region 64 is formed a P-buried layer 66. On top of P-buried layer 66 is formed either a deep N-well 68 or another N-buried layer 68. On top of the N-layer 68 is formed a P-layer 69. It is important to note that the conductivities of the regions illustrated in FIG. 8 may be inverted so that instead of illustrating an N-P-N-P vertical structure, FIG. 18 can illustrate a P-N-P-N vertical structure. In FIG. 18, the region 64 operates as a first current electrode for a transistor, region 68 operates as a channel region for the transistor, and region 66 functions as a second current electrode of the transistor. In one form, the combination of electrode 66 and 64 are a storage node for a memory device. The silicide and graded junction techniques discussed with respect to FIG. 4 can be applied to region 64 and 66. In another form, as illustrated in FIG. 11, the regions 66 and 64 may be formed side-by-side with one another instead of on top of one another as illustrated in FIG. 9.

In FIG. 19, a dielectric layer 70 is deposited or grown over the P-region 69. An opening is then masked and etched through the oxide 70, the P-region 69, the N-region 68, and the P-region 66 to expose a portion of the N-region 64. This etch was performed in a manner similar to the etch performed in FIG. 7 herein. After the opening 74 has been etched in FIG. 19, a deposition and etch process is used to form dielectric spacers 72.

FIG. 20 illustrates that a conductive layer is deposited and patterned to form a conductive contact region 76 which connects to the N-region 64 while being isolated from the region 66, 68 and 69 by the spacer 72. Therefore, the process of FIGS. 18-20 illustrate a method for forming a contact to a buried layer that is embedded below several other doped buried layers wherein the buried layers are used to form vertical transistors for a memory cell, a transistor, or a like semiconductor structure/device.

Figure 21:
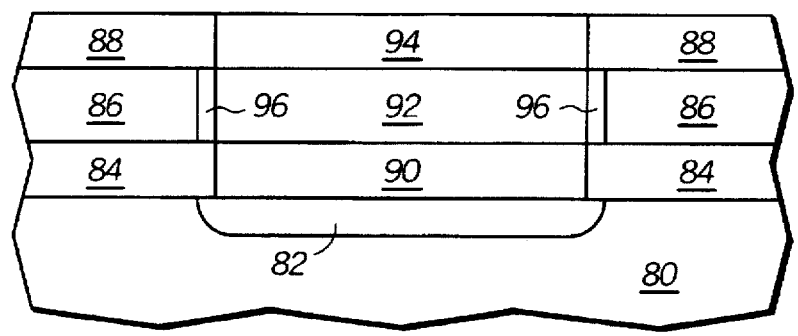
FIGS. 21–22 illustrate, in cross-sectional diagrams, another process for forming a contact for a vertical structure or a random access memory cell in accordance with the present invention.
Figure 22:
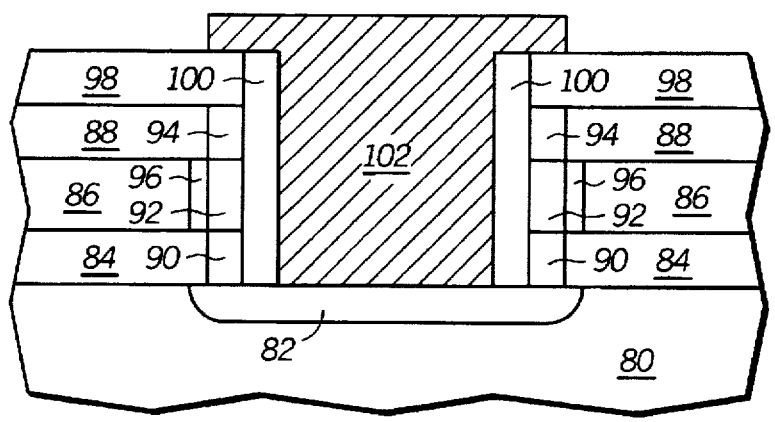

FIG. 21-22 are similar in scope to FIGS. 18-20. FIGS. 21-22 illustrate that the contact of FIG. 20 may also be formed through vertically formed epitaxial transistors as well as buried trench transistor regions. FIG. 21 illustrates a typical epitaxial vertical transistor having a substrate 80 wherein a diffused doped region is formed within the substrate. On top of the substrate 80 are formed an oxide layer 84, a polysilicon layer 86 and an oxide layer 88. An opening is etched through the oxide layers 88 and 84 and the polysilicon layer 86 to expose a portion of the doped region 82. A gate oxide layer is then grown or deposited on the sidewall of the polysilicon layer 86 which was formed by the opening. The opening is then filled by an epitaxial process that forms a drain or source region 90, a channel 92, and a drain or source region 94 as illustrated in FIG. 1.

FIG. 22 then illustrates that a contact can be formed through the regions 90, 92, and 94 to contact to the doped region 82. This contact is formed by etching an opening through the regions 90, 92, and 94. This opening must be less in diameter than a diameter of a top surface of the source 94 to avoid destroying the functionality of the transistor (i.e., etching away the entire channel region or an entire source or drain). This smaller opening is formed by depositing an oxide layer 98, patterning an opening in this oxide layer, and then etching or extending the opening through the regions 90 through 94. After forming the opening which exposes the doped area 82, a dielectric spacer 100 is formed as illustrated in FIG. 22. After formation of the dielectric spacer 100, the conductive layer 102 is deposited to form electrically contact to the region 82 while the layer 102 is being adequately isolated from the regions 90, 92, and 94. In addition, by forming the opening through the regions 90, 92, and 94, the channel region 92 of the transistor of FIG. 21 is further reduced in horizontal thickness, thereby allowing the channel region 92 to more fully deplete or more fully invert.

FIGS. 23-34 illustrate a method for forming a random access memory (RAM) cell or a fast static random access memory (FSRAM) using the vertical transistors taught herein.

Figure 23:
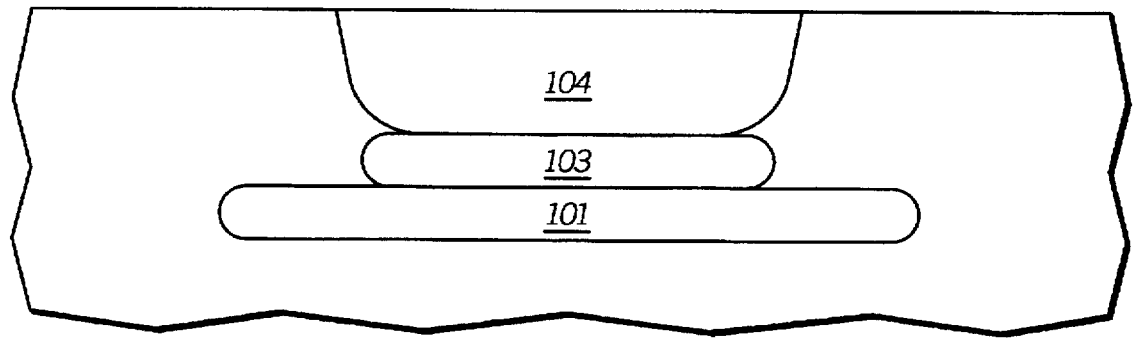
FIGS. 23–34 illustrate, in both cross-sectional diagrams and top perspective views, a process for forming a six transistor (6 T) random access memory (RAM) in accordance with the present invention.

FIG. 23 illustrates that a buried region 101 and a buried region 103 are formed within a substrate. Buried regions 101 and 103 are formed in a manner similar to that illustrated in FIGS. 1-6. In addition, above the buried regions 101 and 103, a deep well region 104 is formed analogous to well regions 22 in FIG. 6. The buried regions and well regions illustrated in FIG. 23 are formed before field oxide or trench isolation are formed on the substrate. Furthermore, the buried layer configuration of FIG. 11 may be used in FIG. 23.

Figure 24:
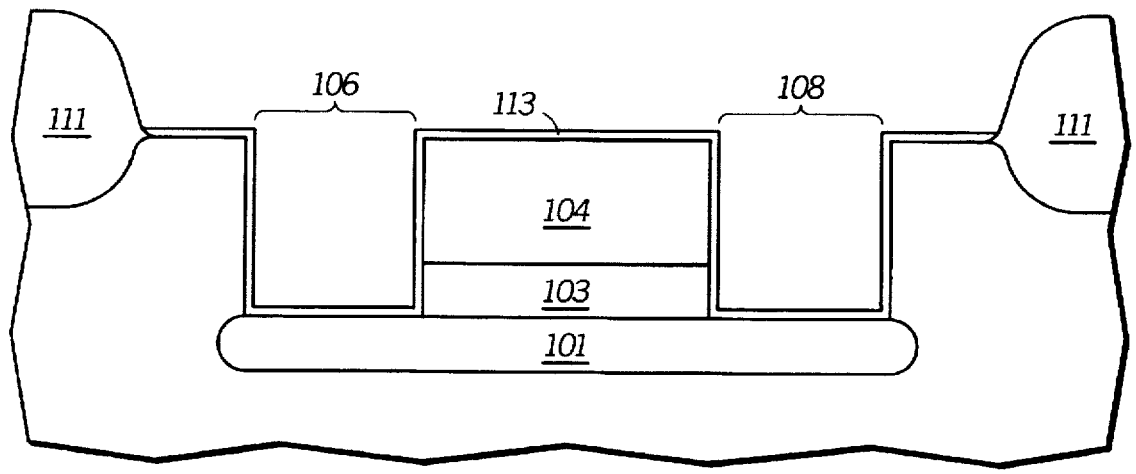

FIG. 24 illustrates field oxide isolation regions 111. Field oxide isolation regions may be replaced with trench isolation or any known dielectric isolation scheme. FIG. 24 illustrates that two physically separated trench regions 106 and 108 are formed to expose a portion of the buried region 101. The trenches formed in FIG. 24 are analogous to the trenches formed in FIG. 7. Once the trench regions 106 and 108 are formed, a gate dielectric layer 113 is deposited within the trenches and laterally adjacent the top surface of the trenches as illustrated in FIG. 24.

Figure 25:
Figure 25:

FIG. 25 illustrates a top perspective view of the partial SRAM cell illustrated in FIG. 24. In order to form a complete SRAM cell, four trenches are formed in the substrate, as illustrated in FIG. 25 (FIG. 24 illustrates one half of the trenches used to form the SRAM cell). FIG. 24 is FIG. 25 cross-sectioned along the line 24 illustrated in FIG. 25. FIG. 4 illustrates half the trenches needed for one cell and the other half of the random access memory cell which is formed by trenches 110 and 112 which, when cross-sectioned, are nearly identical to the cross-sections illustrated via FIGS. 23–24. Since a cross-section of the trench regions 110 and 112 will be similar to a cross-section of the trench regions 106 and 108, only trench regions 106 and 108 are cross-sectioned in figures subsequent to FIG. 25. FIG. 25 illustrates that the four trench regions 106, 108, 110, and 112 are physically separated from one another. In FIG. 25, trench regions 106 and 108 will be used to form three transistors of the six transistor SRAM cell whereas trench 110 and 112 will form the other three transistors of the six transistor SRAM cell.

Figure 26:
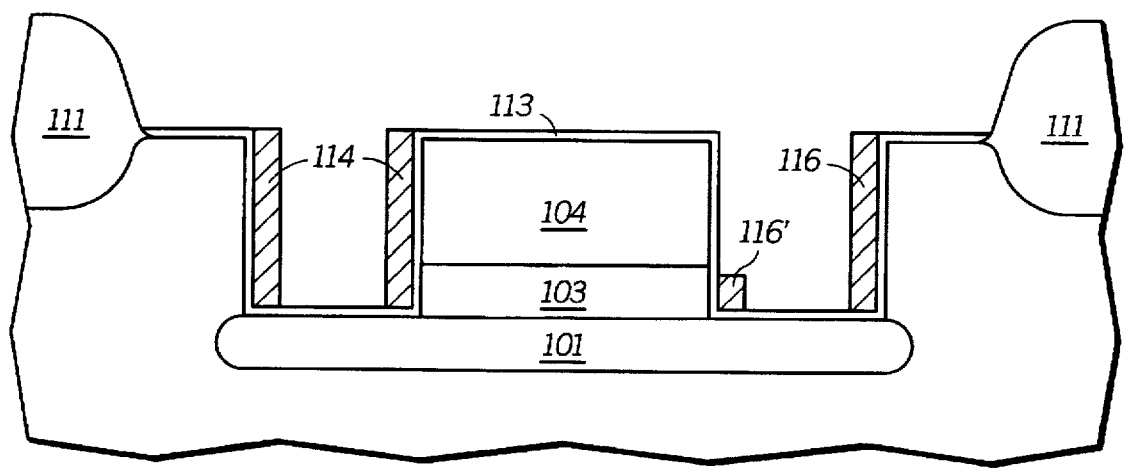

FIG. 26 illustrates that a conformal conductive layer is deposited over the gate dielectric layer 113. The conformal conductive layer is then RIE etched to form a spacer 114. In addition to the formation spacer 114, the etch of the conformal conductive layer will form a second spacer 116 within the trench region 108. A second mask and etch process is then used to reduce a portion of the spacer 116 in height to form a reduced height spacer 116' as illustrated in FIG. 26. Spacer 114 of FIG. 26 is an annular spacer that surrounds an entire sidewall of the trench region 106. Spacer 116 is also annular in shape and surrounds an outer periphery of the trench region 108. The spacer region 116' is formed as a reduced height spacer so that the spacer 116 can form an inversion region to the right of the trench region 108 while not forming a complete inversion region to the left of trench region 108. Therefore, the spacer 116 which is coupled to the spacer portion 116' can gate a first sidewall portion of the trench region 108 while not gating a second portion of the trench sidewall of trench region 108. In some cases, etch steps can be used that completely removes the spacer portion 116' to that no spacer portion 116' is left within the trench 108.

Figure 27:
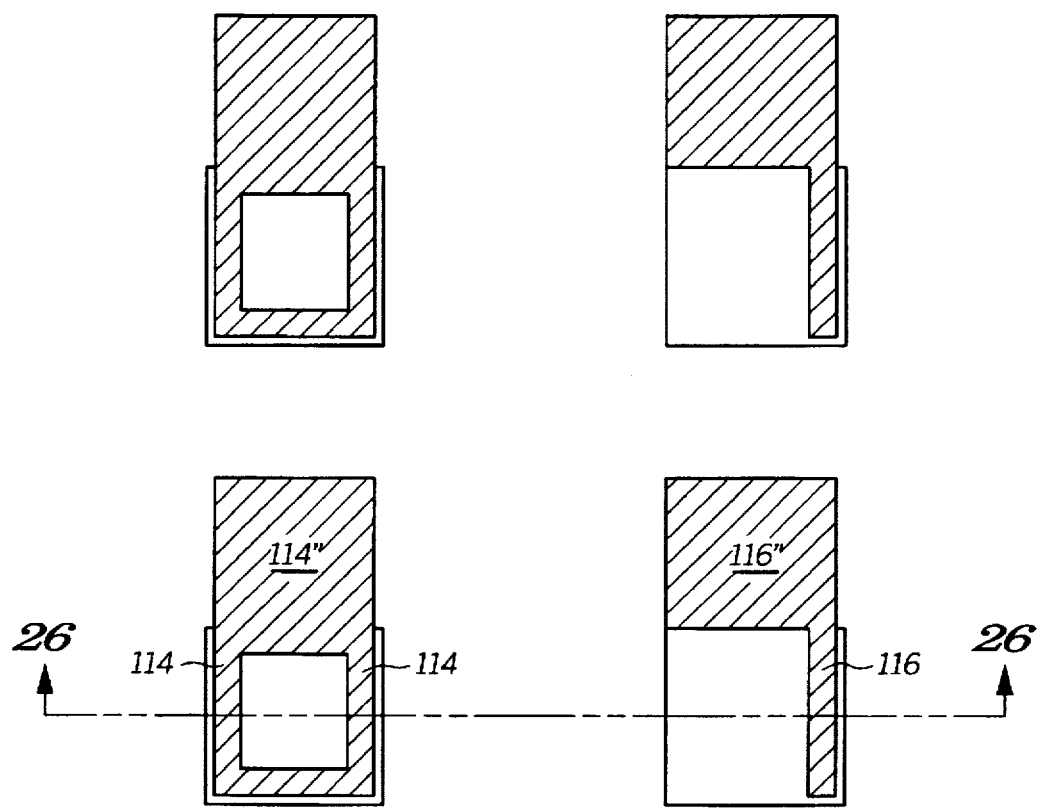

FIG. 27 illustrates a top perspective view of FIG. 26. FIG. 26 is FIG. 27 cross-sectioned along the line 26. FIG. 20 illustrates that the conformal conductive layer which is used to form the spacer 114 is masked so that when the spacer 114 is formed, the spacer is inherently coupled to a tab portion 114". Therefore, the conductive layer used to form spacer 114 is the same conductive layer used to form the tab portion 114". Tab portion 114" provides a contact region which can be easily contacted from above to provide electrical stimulus to the spacer 114. In another form, tab portion 114" may be formed by a deposition step independent of the formation of the spacer 114. FIG. 27 also illustrates that a tab portion 116" is formed in contact with the spacer 116. FIG. 27 illustrates the spacer 116 but does not illustrate the spacer 116'. Spacer 116' is not illustrated in FIG. 27 to show that, in certain embodiments, etched chemistries can be used which will allow for complete removal of the spacer 116'. Spacer 116' is generally referred to a stringer, and stringers can either remain on an integrated circuit or be removed from an integrated circuit depending upon the aggressiveness of the particular etch processing that is used.

Figure 28:
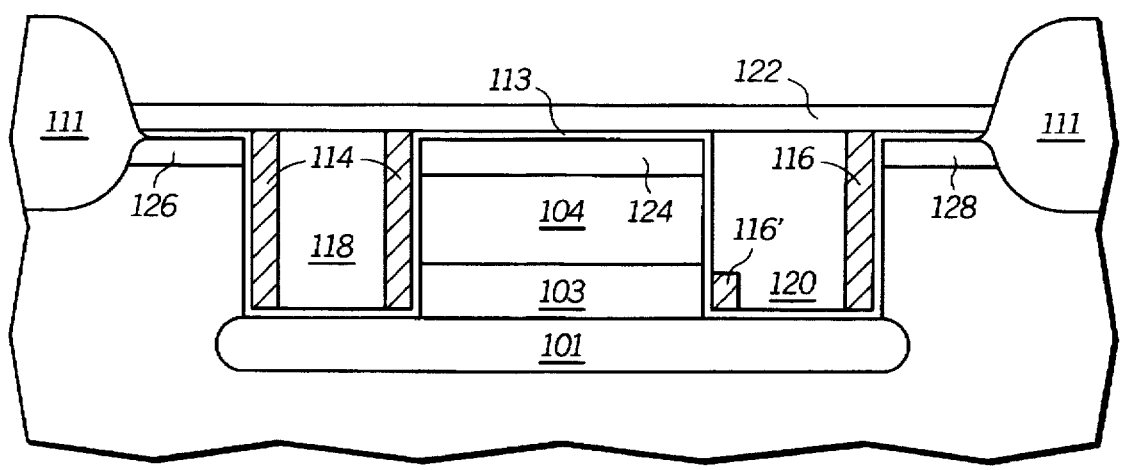

FIG. 28 illustrates that a dielectric layer is deposited and either chemically mechanically polished (CMP) or resist etched back (REB) to form plug regions 118 and 120. Plug region 118 is formed within the trench region 106 and plug region 120 is formed within the trench region 108. Known etch/polish stop material can be deposited overlying or underlying layer 113 in order to provide for more selective chemical mechanical polishing or resist etch back processing. A dielectric layer 122 is formed overlying the dielectric layer 113 and the plug regions 120 and 118. Either before the formation of the dielectric layer 122 or after the formation of the dielectric layer 122, a masking and an ion implantation procedure is used to form N-type regions 126 and 128 within the substrate as illustrated in FIG. 28. A second ion implantation step is used to form a P-type region 124 overlying the well region 104 as illustrated in FIG. 28. In FIG. 28, the well region 104 is N-type, the buried region 103 is P-type, and the buried region 101 is N-type. Furthermore, graded junction techniques and silicide processing can be used as illustrated in FIG. 4 to ensure that a voltage drop between regions 103 and 101 in FIG. 28 are eliminated or reduced.

Figure 29:
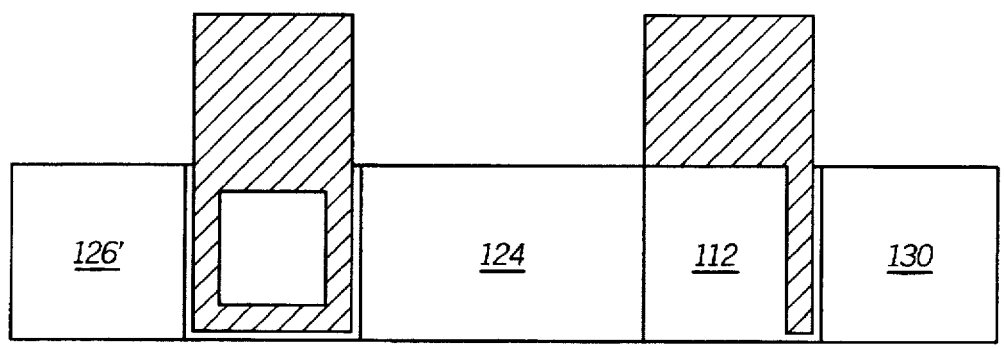
Figure 29:
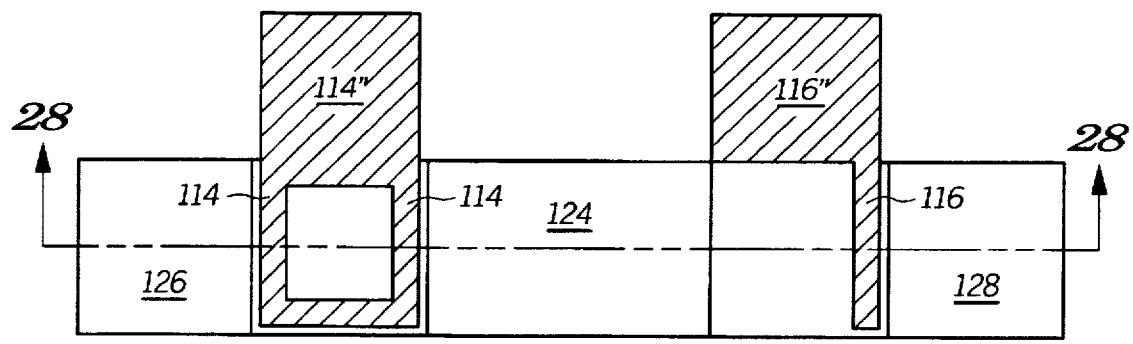

FIG. 29 illustrates a top perspective view of the cross-section of FIG. 28. FIG. 29 illustrates the ion implantation regions 126 and 128 as well as ion implant region 124. A region similar to region 128 is formed as region 130 laterally adjacent to trench region 112 in FIG. 29. In the final bit cell, region 126 and analogous region 126' of FIG. 29 will be coupled to a ground supply voltage. Region 122 will be coupled to a power supply voltage which is typically a voltage between two volts and five volts. Region 116" and the analogous region adjacent trench 112 will be word lines of the SRAM cell. Region 128 will be a first bit line for the SRAM cell and region 130 will be a second bit line for the SRAM cell wherein the first and second bit line will carry logically complementary signals.

Figure 30:
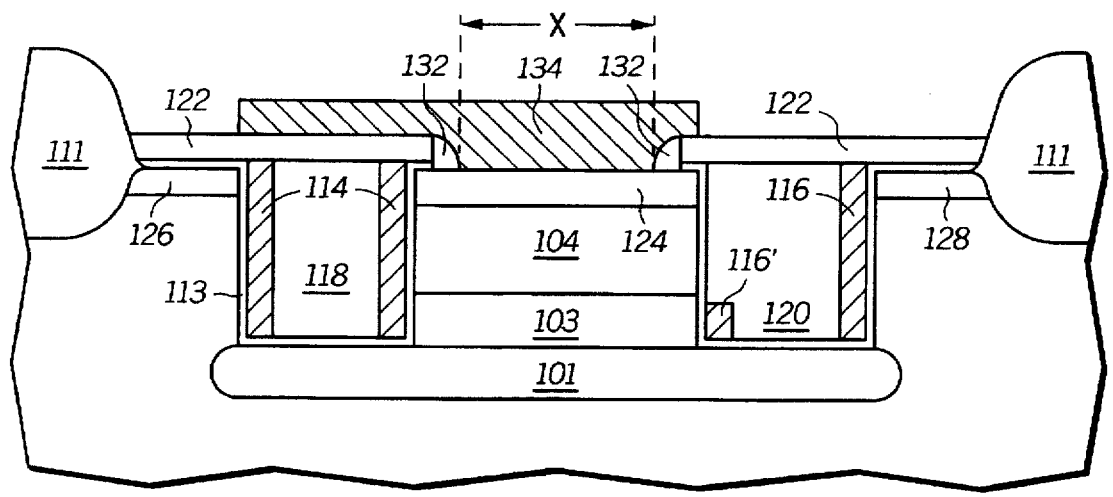

FIG. 30 illustrates that an opening is etched through the dielectric layer 122 and the dielectric layer 113 to expose a top portion of P-type region 124. A dielectric sidewall spacer 132 is formed within the opening made through the dielectric layers 122 and 113. After formation of the opening and the spacer 132, a conductive layer is deposited and patterned to form a conductive interconnect 134 as illustrated in FIG. 30. Conductive interconnect 134 makes electrical contact to the P-type region 124. The width/diameter of the opening in layer 122 after formation of the spacer 132 is a dimension X. The value X would be roughly 1.0 to 0.4 microns using current technology.

Figure 31:
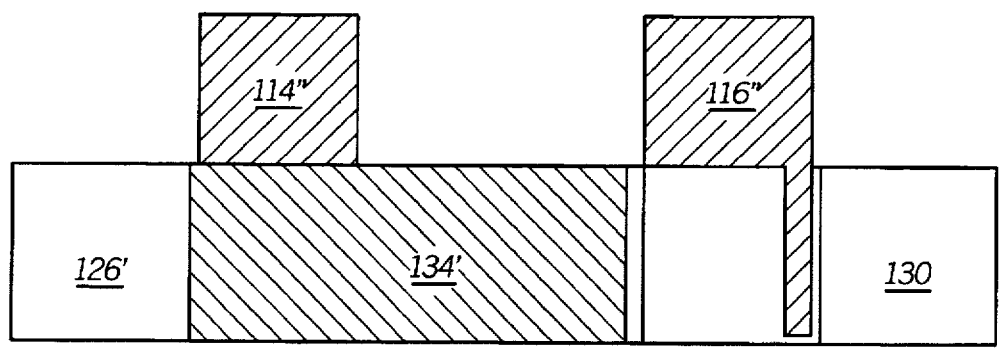
Figure 31:
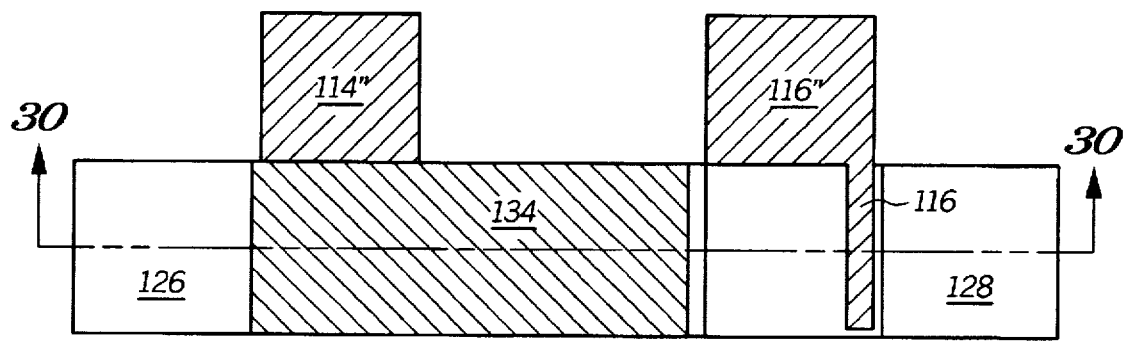

FIG. 31 illustrates a top perspective view of FIG. 30. FIG. 31 illustrates the conductive interconnect region 134 and its analogous counterpart 134' which is illustrated as overlying the trench region 110. Region 134 is used to contact a Vdd power supply voltage to the P-type region 124 illustrated in FIG. 30.

Figure 32:
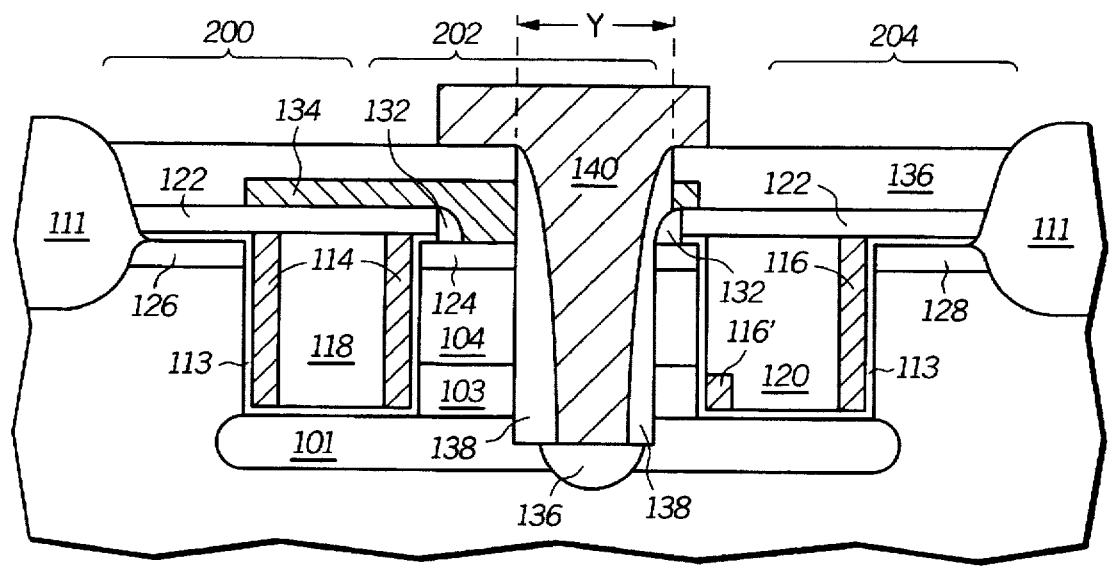

FIG. 32 illustrates that a dielectric layer 136 is deposited over the conductive interconnect region 134. A masking and etching process is then used to etch an opening through the dielectric layer 136, the conductive interconnect 134, the region 124, the region 104, and the buried region 103, to expose a portion of the buried region 101. The opening has a diameter/width Y wherein Y is less than dimension X of FIG. 30. It is important to note that selective etching can be used such that the spacer 132 and dielectric layer 122 provide self-alignment of this opening as illustrated in FIG. 32. The opening Y illustrated in FIG. 34 should be less than the opening X formed in FIG. 30 so that the conductive interconnect layer 134 is not electrically disconnected from its contact to region 124 as illustrated in FIG. 32. After formation of the opening Y which exposes a portion of the buried region 101, dielectric spacers 138 are formed to isolate a sidewall of the interconnect layer 134, and the regions 124, 104, and 103. After formation of the spacer 138, an optional ion implantation step is performed to form an N region 136 within the substrate. N region 136 is ion implanted to ensure that electrical contact is made to buried layer 101 via the opening illustrated in FIG. 32. A conductive layer 140 is then deposited and patterned to form electrical contact to either the region 136 or the region 101.

Figure 33:
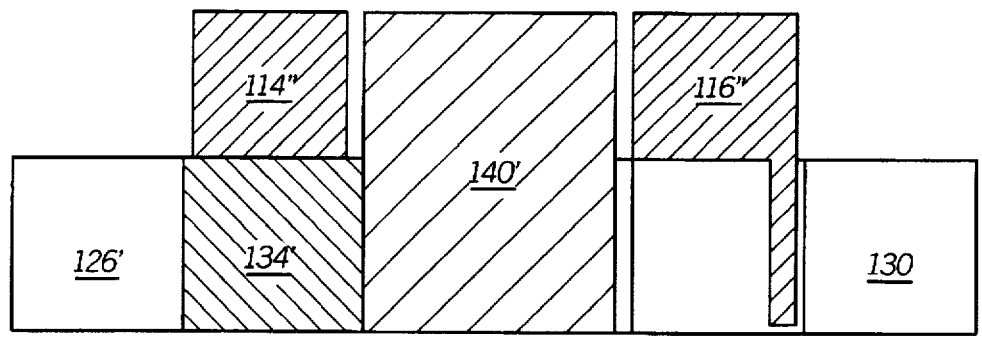
Figure 33:
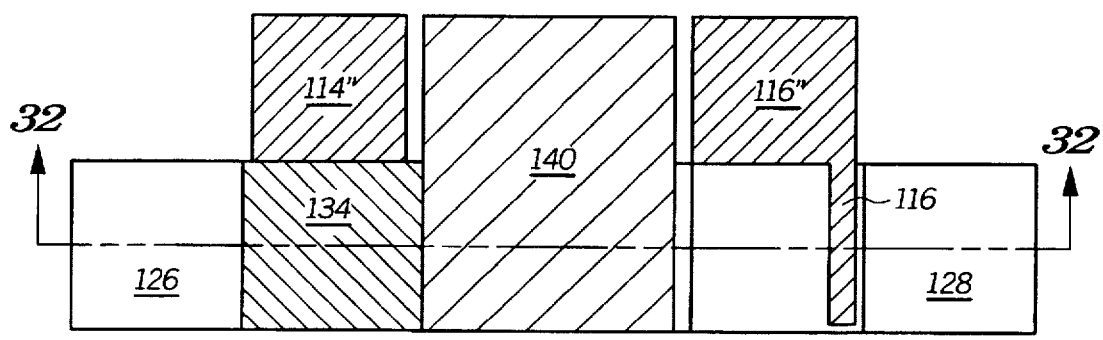

FIG. 33 illustrates, in a top perspective view, the cross-section of FIG. 32. FIG. 33 clearly illustrates the conductive layer 140 as formed in FIG. 32.

Figure 35:
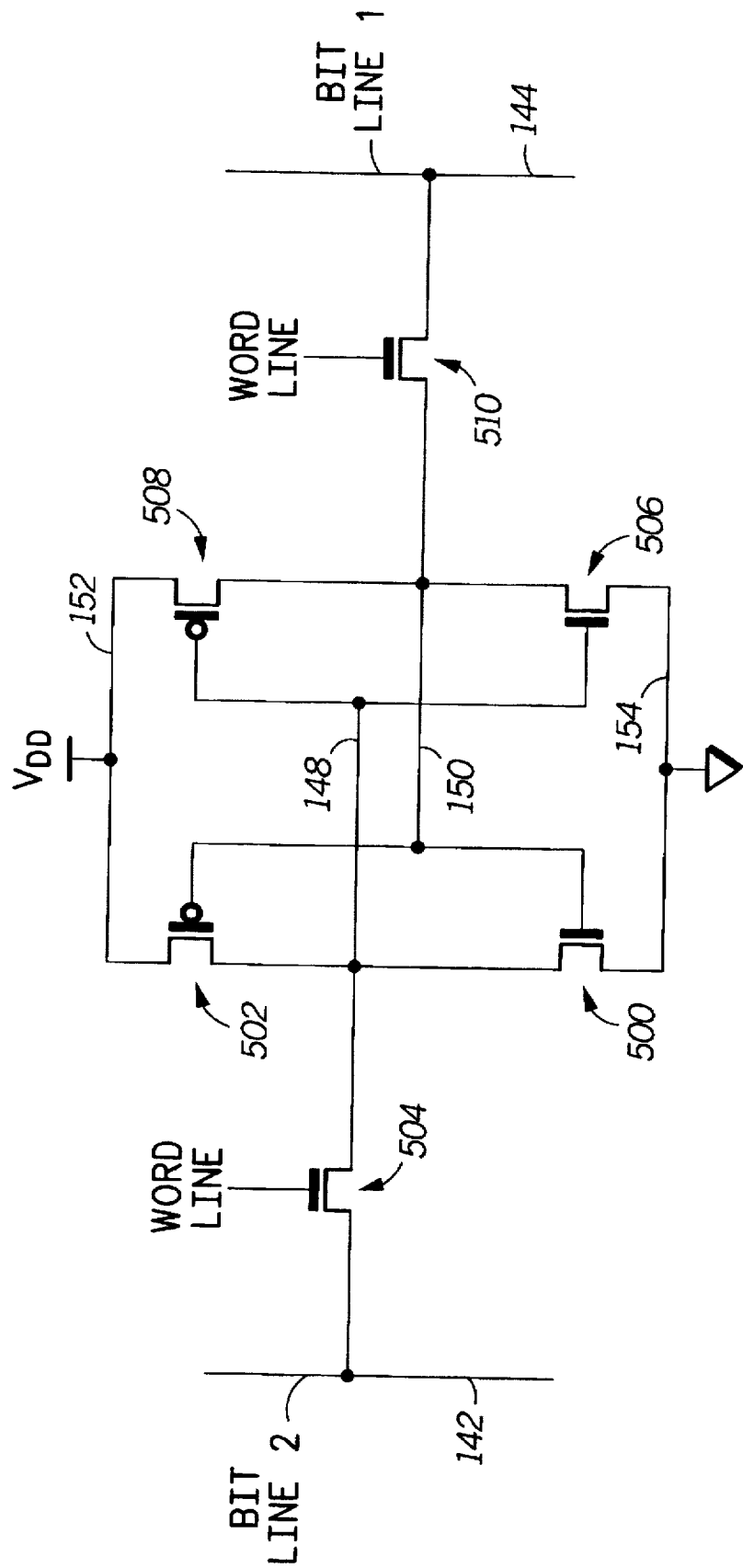
FIG. 35 illustrates, in a circuit diagram, the cross connections and transistors illustrated in FIGS. 32 and 34 in accordance with the present invention.

Returning to FIG. 32, FIG. 32 illustrates three transistors of the six transistors used to form the six transistor SRAM cell. A first transistor is an N-channel transistor which has a gate electrode 114 wherein the gate electrode 114 gates a channel region located between a first current electrode 126 and a second current electrode 101. The transistor formed by regions 114, 101, and 126 is referred to as a latch transistor 500 of an SRAM cell as illustrated in FIG. 35 via latch transistor 500. A second transistor has a gate electrode 114 which gates a channel region through region 104. This second transistor has current electrodes which are formed by regions 124 and 103. This second transistor is a P-type transistor and is referred to as a P-type pull up transistor 502 in FIG. 35. A third transistor, which is an N-channel word line transistor or select transistor 504 in FIG. 35, is illustrated in FIG. 32 as having a gate electrode 116, a first current electrode 128, and a second current electrode 101. The gate electrode 116 gates a channel region located between the current electrode 128 and the current electrode 101. The gate 116 has been reduced in height around a certain portion of the trench region 108 to form a reduced spacer 116' as illustrated in FIG. 32. In a preferred form, the spacer portion 116' can be completely removed. This reducing of the height to form a spacer portion 116' is performed so that spacer 116 does not gate a channel region between region 124 and region 103 to the left of plug region 120.

Therefore, three transistors are illustrated in FIG. 32 and identified in the circuit diagram of FIG. 35 wherein the cross-section of FIG. 32 illustrates three transistors of the six transistors illustrated in FIG. 35. The other three transistors of the SRAM cell are formed via trench regions 110 and 112 and are similar in physical attributes to the three transistors illustrated in FIG. 32. These transistors within trenches 110 and 112 are illustrated in FIG. 35 as being transistors 506-510.

Figure 34:
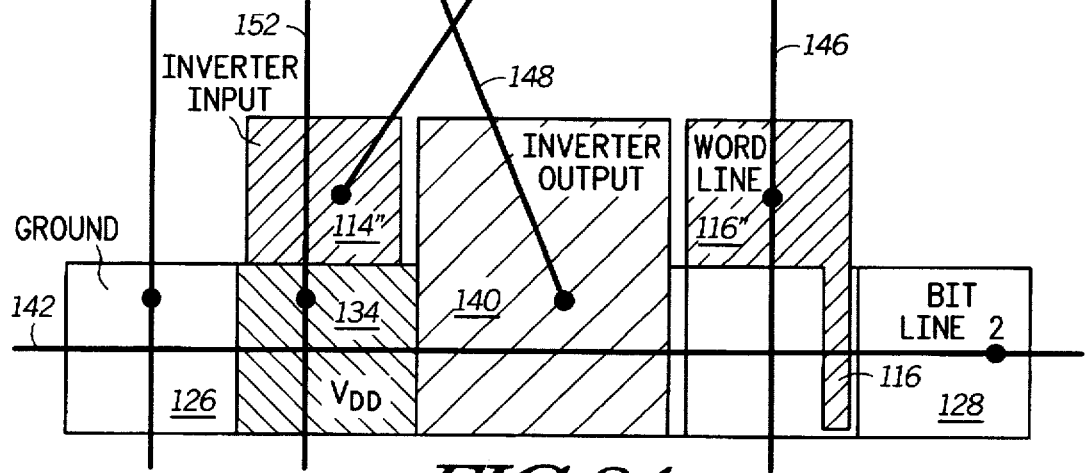

FIG. 34 illustrates a top perspective view of FIG. 32 including metal layer interconnections which are required to complete the interconnections of the SRAM cell. FIG. 34 illustrates conductive layers 142-154. These conductive layers illustrated in FIG. 34 are also illustrated in FIG. 35 so that the top level metal connections of FIG. 34 can be compared to the circuit diagram of FIG. 35. FIG. 34 illustrates that a first bit line is formed by contacting a conductive member 144 to region 130 in FIG. 34. FIG. 34 illustrates that a second bit line is formed via conductive layer 142 which is contacted to region 128. FIG. 34 illustrates that a wordline is formed via the conductive layer 146. The circularly coupled inverters that form the memory element of the SRAMs cell are formed via interconnnects 148 and 150. The ground signal is provided to the SRAM cell via a conductive layer 154 which couples to regions 126 and 126'. A Vdd power supply signal is provided to the region 134 and region 134' to provide power to both sides of the SRAM cell.

FIG. 35 illustrates, in a circuit diagram, the SRAM cell as illustrated in FIG. 32 and FIG. 34.

FIG. 36 illustrates a low temperature (Low T) ramp activated epitaxial growth (LT-TRAG) process for forming epi on a highly clean surface due to HCl presence. This process is performed with low DT (diffusion coefficient *time/temperature) which is highly advantageous for forming close together insitu doped epi regions with sharp (non-graded) junctions. In region A of FIG. 36, the wafers are inserted into an epi chamber at a low temperature (typically within range of 200°–600° C.) to avoid wafer dishing. The temperature is then ramped in a step/region B where optionally there are no growth or etchant gases present in the epi process chamber.

In a step C, dichlorosilane ($SiH_2Cl_2$—an epi growth gas) is pumped into the chamber along with HCl. The HCl input is optional since secondary and primary reactions of $SiH_2Cl_2$ in the epi chamber form HCl as a byproduct, and this byproduct may be enough for the etching purposes described below. Far to the left of the region C (but within region C) is a time period wherein the HCl etch rate is greater than a Si epi growth rate due to the $SiH_2Cl_2$. As temperature is ramped within step C, the etch rate via HCl is eventually overcome by an increasing growth rate due to the presence of $SiH_2Cl_2$. Therefore, the substrate is in a slight etching state in the left portion of region C and the substrate is being slightly etched/cleaned just before and right up until the time epi growth begins in a middle portion of region C. Therefore, the substrate is very clean when epi growth starts and growth continues to progress as time continues to the right hand side of the region C. Also, the HCl in the chamber will remove initial metallic contaminants from the epi and substrate surface up until growth begins and during growth in step C.

In step D, the $SiH_2Cl_2$ is reduced in concentration since SiH2Cl2 only breaks down and grows Si at a high temperature (>850° C. roughly). The SiH2Cl2 is replaced by a growth species such as Si2H6 or SiH4 which breaks down and grows Si at a low temperature of roughly 400°–800° C. Therefore, in step E the bulk of the epi growth is performed at low DT due to the lower temperature in region E. In a step F, growth is complete and the wafers are ramped down to removal temperature. Once a low enough temperature is reached, the wafers are removed from the chamber with the epitaxial growth region now in place.

The above process may be used to form superior epi layers to result in the buried regions of FIGS. 1–6.

In summary, steps A–C ensure that a Cl or HCl environment creates and maintains a clean substrate up until the moment of growth. This is key to avoid point defects, bulk defects (3-D defects), faceting (in some cases), high deviation in growth rate over wafer, epi dislocations, stacking faults in Si, etc. in the epi growth. The steps D through F ensure that once the clean surface begins growth, a lower temperature growth gas is switched into the chamber to reduce total DT thereby allowing thin or thick epi regions with little vertical and lateral diffusion of arsenic, phosphorus, boron, antimony, and like dopants. Bulk growth at 900° C. results in diffusion of dopants even though it may be slight (tens of angstroms or so). Even though the diffusion is slight, many epi layers are now hundreds of angstroms thick and even a 10 Angstrom deviation is a 1–10% shift in a junction position thereby affecting vertical transistor channel regions, Miller capacitance, buried region positioning, and the like. Therefore, by doing bulk growth (FIG. 36—region E) at a lower temp (at best <600° C. or worse case <800° C.), one can form more abrupt PN junctions, better control junction profile, and epitaxial doped thicknesses. By being able to produce abrupt injunctions, one can accurately control the profile of the junctions by changing insitu doping concentrations over time and not relying solely on dopant diffusion to grade junctions. Therefor, the ability to form an abrupt junction does not mean that one must do so since LDD regions and reduction in E fields requires graded junctions in some cases. In this case, the process can be used to custom design the junction in a controlled graded manner In summary, the process of FIG. 36 produced a ramp-activated epitaxial growth region which ensures a clean substrate up until the growth begins thereby reducing defects. This method also has a total low DT so that junctions and diffusion of dopants can be further controlled for ultra thin epi layers and junction profile control.

Figures 37, 38:
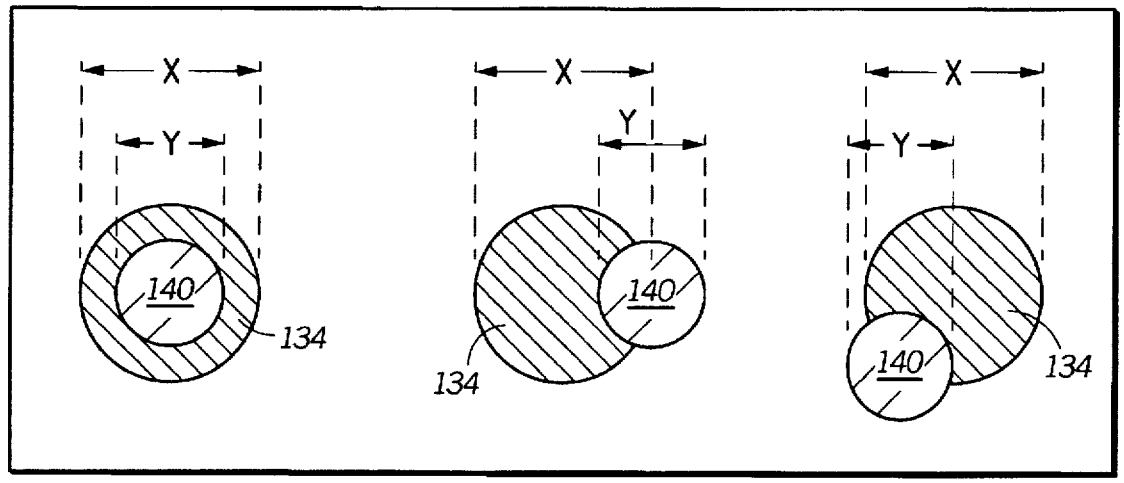
FIG. 37 illustrates, in a top perspective view, three possible contact configurations of a contact illustrated in FIG. 32 in accordance with the present invention.
FIGS. 38–42 illustrate, in a top perspective view, a layout of an SRAM cell using two of the one-half SRAM structures of FIG. 32 in accordance with the present invention.

FIG. 37 illustrates that, in FIG. 37, when the opening Y is less than the opening X, any reasonable degree of misalignment will still produce a functional device and not disconnect layer 134 from region 124. In other words, the contact of Vdd to the SRAM is not compromised by misalignment as long as Y<X. See also FIG. 41.

FIGS. 38–42 illustrates one way in which the device of FIG. 32 can be used to form a complete SRAM cell layout. FIG. 38 illustrates that the buried layer 101 illustrated in FIG. 32 is formed twice wherein these two buried regions 101 are separated from one another as illustrated.

Figure 39:
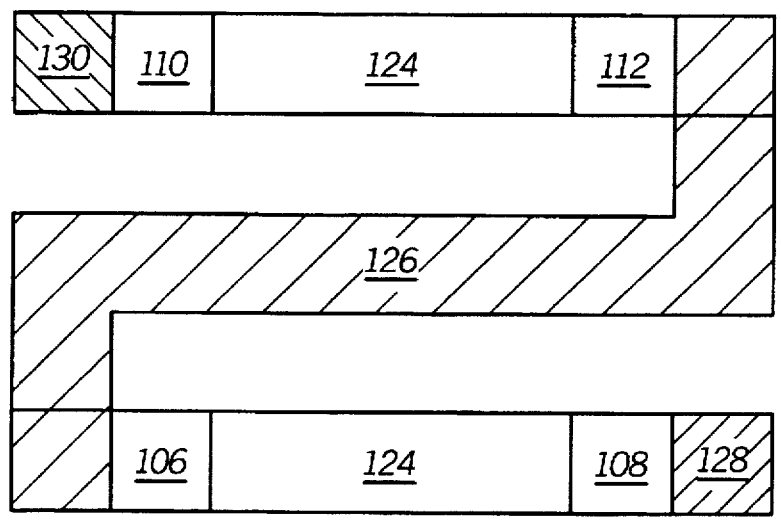
Figure 40:
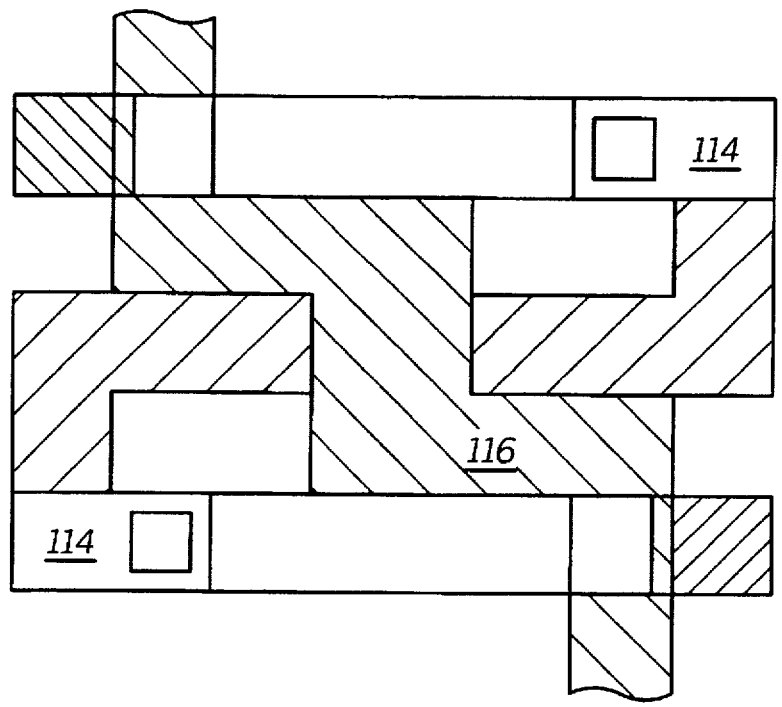

FIG. 39 illustrates the ground diffusion 126 of FIG. 32, the four trench regions 106, 108, 110, and 112 (see FIG. 25), and the P-type Vdd diffusion region 124 of FIG. 32. FIG. 39 also illustrates the bit line diffusion 128 and the complementary bit line diffusion 130. FIG. 40 illustrates that a polysilicon layer is deposited and etched to form the word line 116 having a spacer portion 116' as illustrated in FIG. 32. The spacer portion 116' is assumed to be totally removed and not illustrated in FIG. 40.

Figure 41:
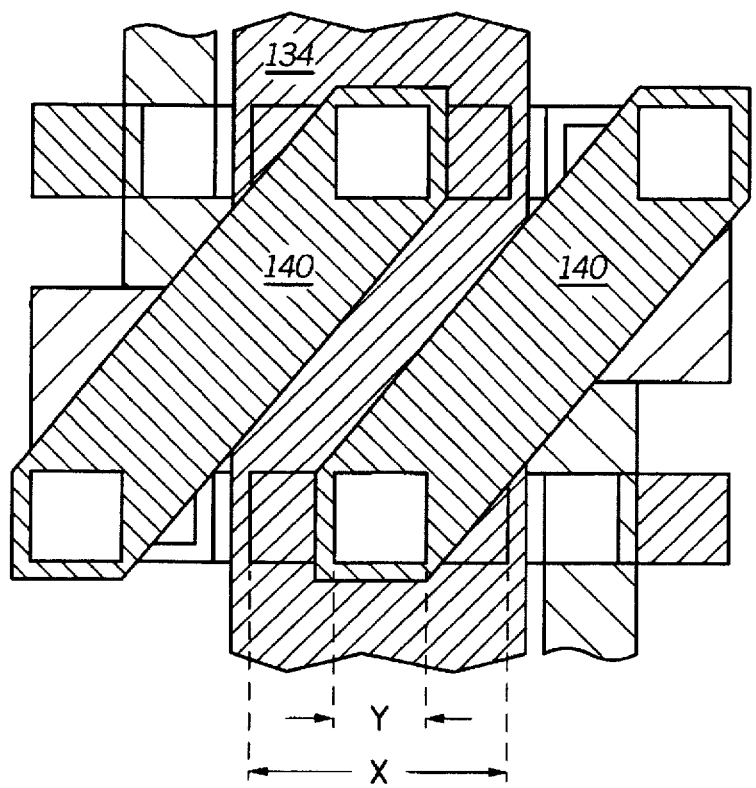

FIG. 41 illustrates a position of the Vdd conductive interconnect 134 illustrated in FIG. 32. This Vdd layer 134 is contacted through the opening having the dimension X as illustrated in FIG. 30 and FIG. 41. On top of the Vdd interconnect 134 is the cross couple connections 140 illustrated in FIG. 32 (connections 148 and 150 in FIG. 34). The dimension Y of FIG. 32 is illustrated in FIG. 41.

Figure 42:
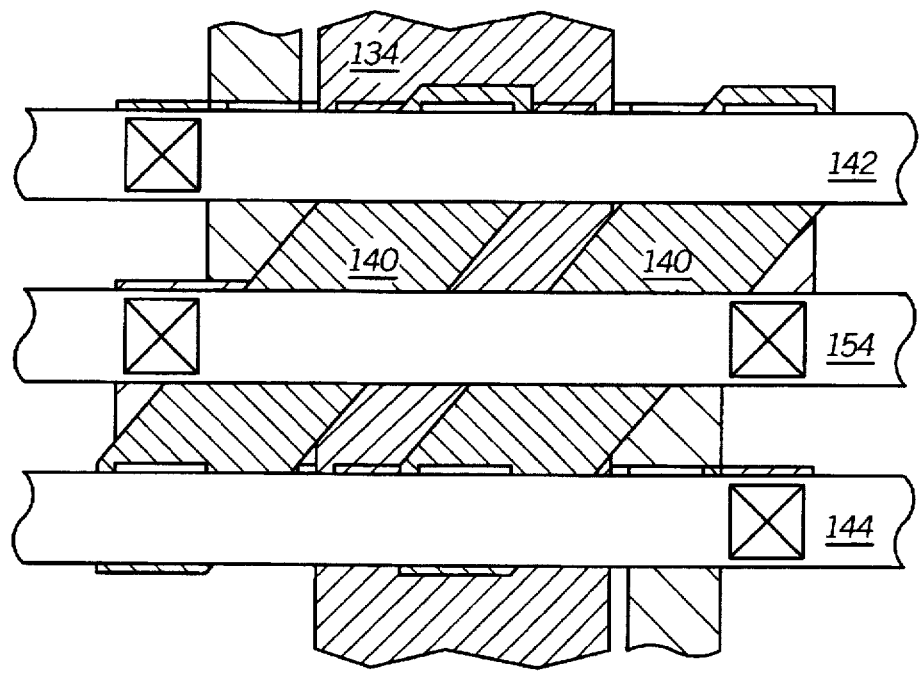

In FIG. 42, the bit line 142 and the complementary bit line 144 are illustrated as coupling to the underlying diffusions 128 and 130 of FIG. 39. In FIG. 42, a ground line 154 having two connections per cell is illustrated. The two ground (GND) line contacts may slightly expose or intersect the cross-coupling 140 thereby requiring that the two contacts for GND be internally insulated around their circumference by a dielectric sidewall spacer before layer 154 is formed to avoid electrical short circuiting between the cross-coupling 140 and the ground line 154. 'L'-shaped layout of the layers 140 may also aid in reducing the need for a dielectric spacer.

Figure 43:
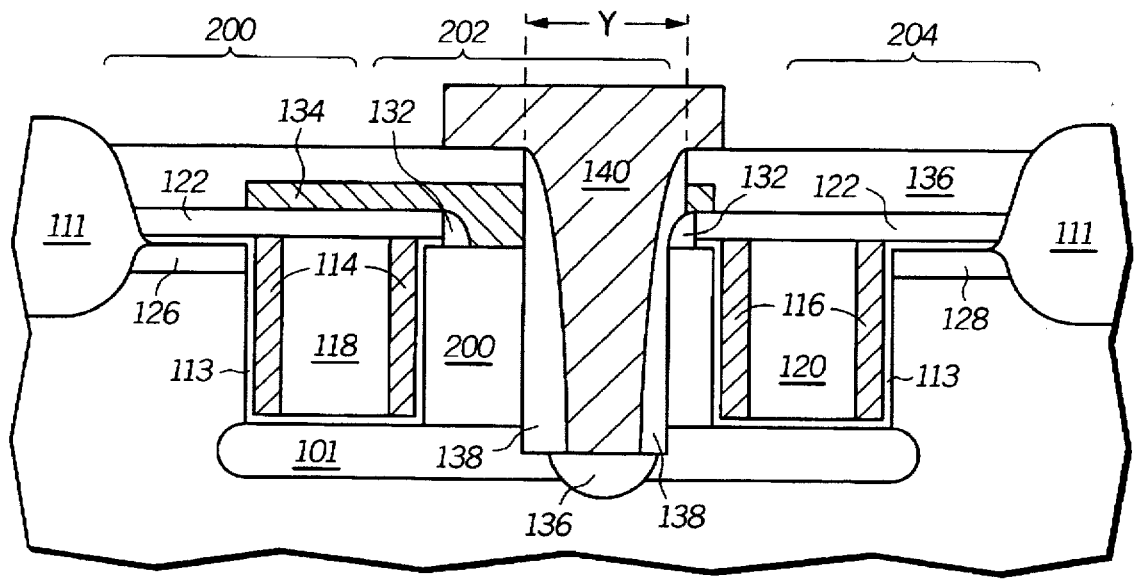
FIG. 43 illustrates, in a cross sectional diagram, an alternative embodiment to the structure of FIG. 32 wherein a load resistor replaces a P-channel RAM pull-up transistor.

FIG. 43 illustrates that the P-channel transistor comprising current electrodes 103 and 124, channel region 104, and gate electrode 114 in FIG. 32 may be placed with a resistor load 200 coupled between the storage node 101 and the Vdd interconnect 134. If this resistor load is used, then the need to drive down the spacer 116 to form a stringer or non-existent spacer portion 116' may also be needed for the spacer 114. However, one may choose not to drive down the spacers and in this case (as illustrated in FIG. 43) the voltages on the gates 116 and 114 may affect the conductivity of the resistor and change its resistance. This change can be controlled by thicker oxide regions, counter-doping for a high threshold, and/or a larger horizontal separation between the contact dimension X and the sidewall of the spacers.

Figure 44:
FIGS. 44–50 illustrate, in a top perspective view, another layout of an SRAM cell using two of the one-half SRAM structures of FIG. 32 in accordance with the present invention.
Figure 44:

FIGS. 44–50 illustrate another layout that can be used for the device of FIG. 32 to form a random access memory (RAM) cell. In FIG. 44, the two N buried layers 101 are formed.

Figure 45:
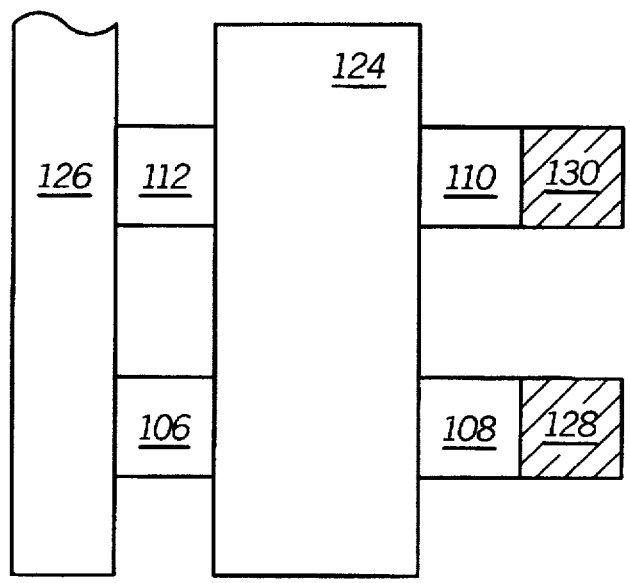

In FIG. 45, the trenches 106, 108, 110, and 112 are formed and a Vdd diffusion 124 is formed. Bit line diffusions 130 and 128 are formed along with a ground (GND) diffusion 126. It is important to note that the polysilicon interconnects and the diffusion regions in the layouts taught herein could be silicided or salicided for improved conductivity.

Figure 46:
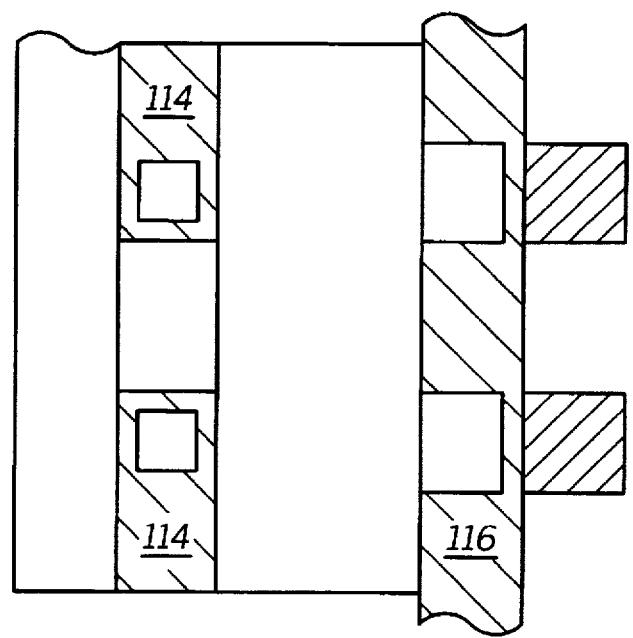

In FIG. 46, the word line 116 is formed and inverter gate inputs 114 are formed as illustrated in cross-section FIG. 32.

Figure 47:
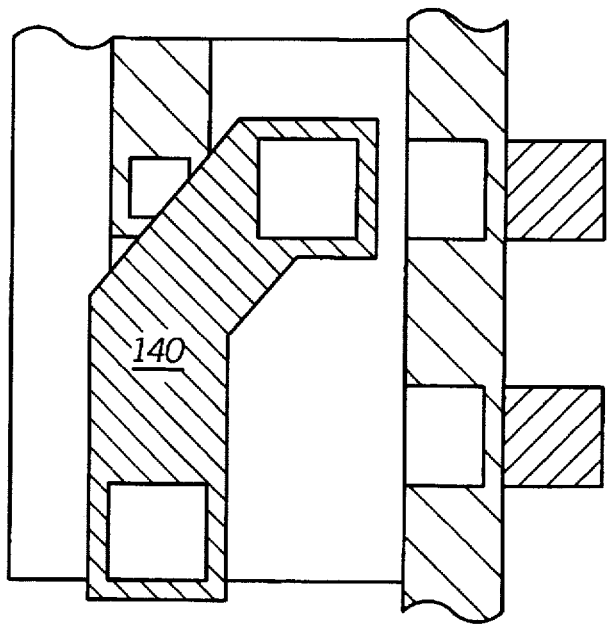

In FIG. 47, one cross-couple 140 is formed to form one-half of the circular inverter for the SRAM cell.

Figure 48:
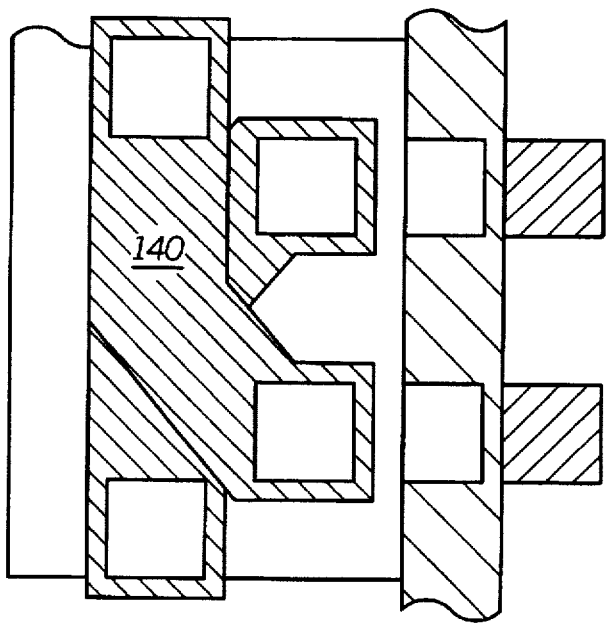

In FIG. 48, the other cross-couple 140 is formed to form the other half of the circular inverter for the SRAM cell. In FIG. 48, the two cross couples 140 are not symmetric and while achieving a smaller surface area that the layout of FIG. 42, the non-symmetry of the cross-couples 140 is a trade-off that must be considered.

Figure 49:
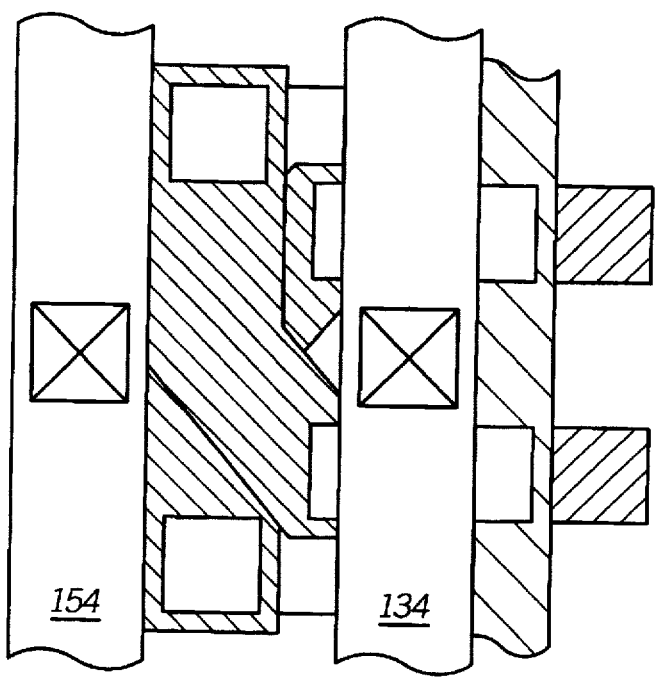

In FIG. 49, the ground (GND) diffusion is coupled to a conductive line 154 and the Vdd diffusion is coupled to a conductive line 134.

Figure 50:
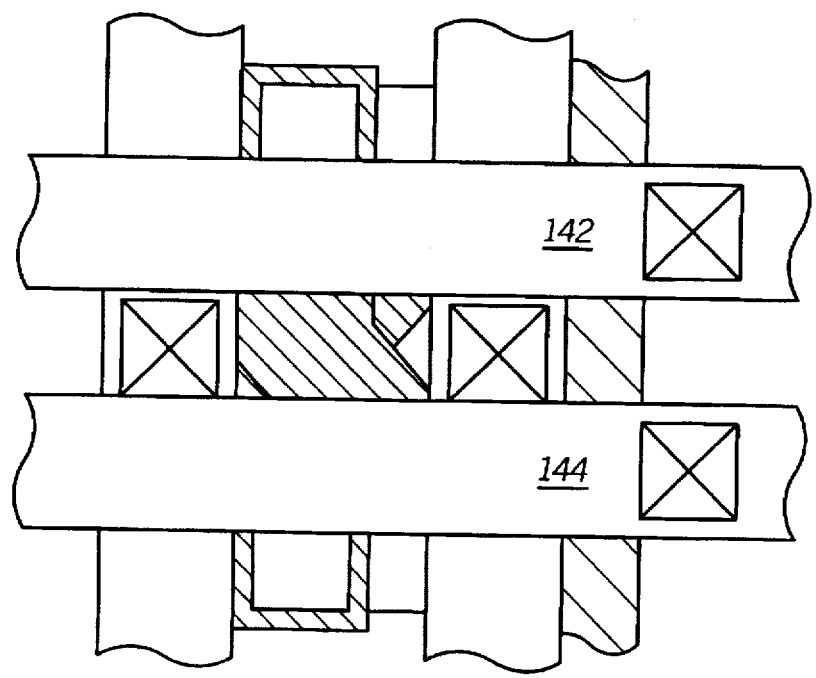

In FIG. 50, the bit line 142 and the complementary bit line 144 are formed and contacted to the bit line diffusions 128 and 130 of FIG. 45. It is important to note that the contacts illustrated in FIGS. 47–50 may "clip" underlying conductive regions and interconnects thereby requiring dielectric spacers to avoid unwanted electrical short-circuiting. This "clipping" can be avoided in the alternative by making the cell slightly larger to give the contacts more room for misalignment.

While the present invention has been illustrated and described with reference to specific embodiments, further modifications and improvements will occur to those skilled in the art. For example, plurality is intended to mean any value between 2 and infinity and should not be limited to any one constant or sub-range within 2 to infinity. Binary information or binary bit as taught herein is any system containing at least two values and includes ternary and quaternary logic systems (logic 0, logic 1, tri-state). The P-channel transistors taught herein can be polysilicon or like resistors to form 4-T SRAM cells. Tilt rotational ion implants can be used to dope vertical channel regions. It is to be understood, therefore, that this invention is not limited to the particular forms illustrated and that it is intended in the appended claims to cover all modifications that do not depart from the spirit and scope of this invention.

What is claimed is:

1. A method for forming a semiconductor device, the method comprising:

providing a substrate;

forming a trench region within the substrate, the trench region having an annular-shaped sidewall;

forming a P-doped channel region adjacent a first portion of the annular-shaped sidewall;

forming an N-doped channel region adjacent a second portion of the annular-shaped sidewall, wherein the first portion and the second portion are physically different regions; and forming a gate electrode adjacent the annular-shaped sidewall to control current flow in both the N-doped channel region and the P-doped channel region.

2. The method of claim 1 wherein one of either the P-doped channel region or the N-doped channel region is doped via a tilt ion implant process.

3. The method of claim 1 wherein one of either the P-doped channel region or the N-doped channel region is formed via a deep well ion implant and thermal cycle process.

4. The method of claim 1 wherein one of either the P-doped channel region or the N-doped channel region is formed via an insitu doped epitaxially grown region.

5. The method of claim 1 wherein the P-doped channel region is formed adjacent an N-doped current electrode and the N-doped channel region is formed adjacent a P-doped current electrode.

6. The method of claim 5 wherein the P-doped current electrode and the N-doped current electrode share a common interface.

7. The method of claim 6 wherein the N-doped current electrode is laterally adjacent the P-doped current electrode.

8. The method of claim 5 wherein the P-doped current electrode and the N-doped current electrode share a common interface wherein this common interface is silicided to reduce a voltage drop between the P-doped current electrode and the N-doped current electrode.

9. The method of claim 5 wherein either: (1) the N-doped current electrode is underlying the P-doped current electrode; or (2) the N-doped current electrode is overlying the P-doped current electrode.

10. The method of claim 1 wherein the gate electrode is formed by depositing a conformal conductive layer and etching the conformal conductive layer to form a conductive spacer around the annular-shaped sidewall to function as the gate electrode.

11. The method of claim 10 wherein a masking layer is used to mask a portion of the conformal conductive layer outside the trench region to create a conductive tab region from the conformal conductive layer wherein the conductive tab region is coupled to the conductive spacer.

12. The method of claim 1 wherein a gate dielectric layer separates the gate electrode from both the P-doped channel region and the N-doped channel region.

13. The method of claim 1 wherein a conductive surface area is coupled to the gate electrode wherein the conductive surface area is outside of the trench region wherein the conductive surface area is used to form an electrical contact region so that the gate electrode can be electrically biased.

14. The method of claim 1 wherein a plug region is formed within the trench region and within an inner circumference of the gate electrode to at least partially fill the trench region.

15. The method of claim 1 wherein a plug region is formed within the trench region and within an inner circumference of the gate electrode to fill the trench region so that an ion implant process used to form a current electrode at a top surface of the substrate does not significantly implant a bottom portion of the trench.

16. The method of claim 1 wherein an N-doped current electrode is formed adjacent the first portion of the annular-shaped sidewall and overlying the P-doped channel region.

17. The method of claim 1 wherein a P-doped current electrode is formed adjacent the second portion of the annular-shaped sidewall and overlying the N-doped channel region.

18. A method for forming a semiconductor device, the method comprising:

providing a substrate;

forming a first doped buried region of a first conductivity type within the substrate;

forming a second doped buried region adjacent the first doped buried region, the second doped buried region being of a second conductivity type;

forming a semiconductor region over the second doped buried region;

doping the semiconductor region such that: (1) a first portion of the semiconductor region is doped having the first conductivity type wherein the first portion of the semiconductor region overlies a portion of the second doped buried region; and (2) a second portion of the semiconductor region is doped having the second conductivity type wherein the second portion of the semiconductor region overlies a portion of the first doped buried region, the first portion of the semiconductor region being in close proximity to the second portion of the semiconductor region to form an interface region therebetween;

forming a trench region having a sidewall and a bottom surface, the trench region being formed through the interface region to expose the first portion of the semiconductor region with a first portion of the sidewall of the trench region, expose the second portion of the semiconductor region with a second portion of the sidewall of the trench region, and expose the first doped buried region with the bottom surface of the trench region;

forming an oxide over the trench sidewall and bottom surface;

depositing a conductive layer of material;

etching the conductive layer of material to form a gate sidewall spacer adjacent the sidewall;

forming a first doped region of the second conductivity type above the first portion of the semiconductor region; and forming a second doped region of the first conductivity type overlying the first portion of the semiconductor region, wherein the gate sidewall spacer controls current flow through the first portion of the semiconductor region adjacent the sidewall of the trench region and the second portion of the substrate adjacent the sidewall of the trench region.

19. The method of claim 18 wherein the step of forming a second doped buried region adjacent the first doped buried region comprises:

forming the second doped buried region overlying and in contact with the first doped buried region.

20. The method of claim 18 wherein the step of forming a second doped buried region adjacent the first doped buried region comprises:

forming the second doped buried region laterally adjacent and in contact with the first doped buried region.

21. The method of claim 18 wherein the step of forming a second doped buried region adjacent the first doped buried region comprises:

forming a metallic region between the second doped buried region and the first doped buried region to reduce a voltage drop between the first doped region and the second doped region.

22. The method of claim 18 wherein the gate sidewall spacer is annular in shape and the method further comprises the step of:

forming a dielectric plug region within a circumference of the gate sidewall spacer.

23. The method of claim 18 wherein one of either the step of forming the first doped buried region or the step of forming the second doped buried region comprises:

forming one of either the first doped buried region or the second doped buried region by implanting dopant atoms into a substrate portion and epitaxially growing substrate material over the dopant atoms.

24. A method for forming a semiconductor device, the method comprising the steps of:

providing a substrate having a surface;

forming a doping barrier layer overlying the substrate, the doping barrier layer having an opening which exposes a portion of the substrate to define a first exposed substrate portion, a second exposed substrate portion, and a third exposed substrate portion wherein the first and third exposed substrate portions of the substrate are separated by the second exposed substrate portion;

forming a trench region within the second exposed substrate portion, the trench region being used to form at least one vertical transistor device;

doping the first exposed substrate portion with N-type dopant atoms; and doping the second exposed substrate portion with P-type dopant atoms.

25. The method of claim 24 wherein the step of forming the trench region comprises:

forming both a P-type electrode and an N-type electrode at a bottom portion of the trench region.

26. The method of claim 25 wherein the step of forming the trench region comprises:

defining a first channel region between the P-type electrode and the second exposed substrate portion which is doped with P-type dopant atoms, and defining a second channel region between the N-type electrode and the first exposed portion which is doped with N-type dopant atoms.

27. The method of claim 26 wherein the step of forming the trench region comprises:

forming a gate electrode annular spacer within the trench region to control current flow through both the first channel region and the second channel region.

28. A method for forming a semiconductor device, the method comprising the steps of:

providing a substrate having a top surface;

forming a trench region within the substrate having a sidewall and a bottom portion, the sidewall having a first half and a second half;

forming a first conductive region at the bottom portion of the trench region and within the substrate;

forming a second conductive region adjacent the first half of the sidewall and adjacent a top surface of the substrate;

forming a third conductive region adjacent the second half of the sidewall and adjacent a top surface of the substrate, the second and third conductive regions being physically separated from one another by the trench region;

forming a first conductive sidewall spacer within the trench having a first height laterally adjacent first half of the sidewall and a second height laterally adjacent the second half of the sidewall wherein the first height is greater than the second height; and forming a second conductive sidewall spacer within the trench region and adjacent the first conductive sidewall spacer.

29. The method of claim 28 wherein the step of forming the first conductive sidewall spacer comprises:

forming the first conductive sidewall spacer such that the second height is zero wherein the spacer adjacent the second half of the sidewall is completely removed.

30. The method of claim 28 wherein the step of forming the first conductive sidewall spacer comprises:

defining a channel region between the first and second conductive regions, the channel region being gated by the first conductive sidewall spacer.

31. The method of claim 28 wherein the step of forming the first conductive sidewall spacer comprises:

defining a first channel region between the first and third conductive regions the first channel region being gated by the second conductive sidewall spacer.

32. The method of claim 31 wherein the step of forming the first conductive sidewall spacer comprises:

defining a second channel region between the first and second conductive regions, the second channel region being gated by the first conductive sidewall spacer.

33. The method of claim 28 further comprising the step of:

forming a central transistor through a middle portion of the second conductive sidewall spacer wherein a channel region of the central transistor is gated by the second conductive sidewall spacer.

34. The method of claim 33 wherein the step of forming the central transistor comprises:

forming the central transistor as a P-channel transistor coupled to the first conductive region and wherein the first, second, and third conductive regions form current electrodes for two serially coupled N-channel transistors.

35. The method of claim 33 wherein the step of forming the central transistor comprises:

forming the central transistor wherein the central transistor is coupled to the first conductive region.

36. The method of claim 28 wherein the step of forming the first conductive sidewall spacer comprises:

forming a first contact tab region coupled to the first conductive sidewall spacer to allow for electrical contact to the first conductive sidewall spacer.

37. The method of claim 28 wherein the step of forming the second conductive sidewall spacer comprises:

forming a first contact tab region coupled to the second conductive sidewall spacer to allow for electrical contact to the second conductive sidewall spacer.

38. A method for forming a semiconductor device, the method comprising the steps of:

providing a substrate having a top surface, the substrate having a first area, a second area, and a third area wherein the first area is laterally adjacent the second area and the second area is laterally adjacent the third area;

forming a first N-channel transistor within the first area of the substrate wherein the first N-channel transistor has a channel region wherein current flows substantially vertically through the channel region;

forming a second N-channel transistor within the third area of the substrate wherein the second N-channel transistor has a channel region wherein current flows substantially vertically through the channel region;

forming a P-channel transistor within the second area of the substrate wherein the P-channel transistor has a channel region wherein current flows substantially vertically through the channel region; and wherein the P-channel transistor, the first N-channel transistor, and the second N-channel transistor all connect to a common node formed within the substrate.

39. A method for forming a semiconductor device, the method comprising the steps of:

forming a first N-type region of substrate material;

forming a first P-type region overlying the first N-type region wherein the first P-type region abuts the first N-type region and is made of the substrate material;

forming a second N-type region overlying the first P-type region wherein the second N-type region abuts the first P-type region and is made of the substrate material;

forming a second P-type region overlying the second N-type region wherein the second P-type region abuts the first N-type region and is made of the substrate material;

forming a dielectric layer overlying the second P-type region;

etching an opening through the dielectric layer, the first and second P-type regions, and the second N-type region to expose a portion of the first N-type region, the opening having a sidewall;

forming a sidewall dielectric layer laterally adjacent the sidewall of the opening; and forming a conductive layer within the opening which connects to the first N-type region.

40. The method of claim 39 further comprising the step of:
implanting additional N type dopant into the first N-type region of substrate material after etching the opening.

41. The method of claim 39 wherein the first and second N-type regions are coupled as current electrodes for a vertical transistor.

42. The method of claim 39 wherein the first and second P-type regions are current electrodes for a vertical transistor.

43. A method for forming a semiconductor device, the method comprising the steps of:

forming a first P-type region of substrate material;

forming a first N-type region above the first P-type region wherein the first N-type region abuts the first P-type region and is made of the substrate material;

forming a second P-type region above the first N-type region wherein the second P-type region abuts the first N-type region and is made of the substrate material;

forming a second N-type region above the second P-type region wherein the second N-type region abuts the first P-type region and is made of the substrate material;

forming a dielectric layer above the second N-type region;

etching an opening through the dielectric layer, the first and second N-type regions, and the second P-type region to expose a portion of the first P-type region, the opening having a sidewall;

forming a sidewall dielectric layer laterally adjacent the sidewall of the opening; and forming a conductive layer within the opening which connects to the first P-type region.

44. A method for forming a semiconductor device, the method comprising the steps of:

forming a first doped region within a substrate;

forming a second doped region above the first doped region wherein the second doped region abuts the first doped region and is made of the substrate material, the second doped region being of a first conductivity type;

forming a third doped region above the second doped region wherein the third doped region abuts the second doped region and is made of substrate material, the second doped region being of a second conductivity type different from the first conductivity type;

forming a dielectric layer above the third doped region;

etching an opening through the dielectric layer, the second doped region and the third doped region to expose a portion of the first doped region, the opening having a sidewall;

forming a sidewall dielectric layer laterally adjacent the sidewall of the opening; and forming a conductive layer within the opening which connects to the first doped region.

45. The method of claim 44 wherein the step of forming the first doped region comprises:

forming the first doped region as a first P-doped portion and a second N-doped portion that are adjacent and in contact with one another.

46. The method of claim 44 wherein the step of forming the first doped region comprises:

forming the first doped region a first P-doped portion and a second N-doped portion that are adjacent and in contact with one another; and forming a metallic interface region between the first P-doped portion and the second N-doped portion to reduce a voltage drop between the first P-doped portion and the second N-doped portion.

47. A method for forming a transistor structure comprising the steps of:

providing a substrate;

forming a trench region within the substrate, the trench region having a top portion, a bottom portion, a sidewall, a first half and a second half;

forming a first doped current electrode at a bottom portion of the trench region;

forming a second doped current electrode at a top portion of the trench region, a channel region being defined between the first and second doped current electrodes and adjacent the first half of the trench region;

forming an annular conductive sidewall conductor within the trench region wherein the second annular conductive sidewall conductor controls a current flow through the channel region; and reducing a height of the annular conductive sidewall conductor so that a height of the annular conductive sidewall conductor adjacent the first half of the trench region is greater than a height of the annular conductive sidewall conductor adjacent the second half of the trench region.

48. The method of claim 47 wherein the height of the annular conductive sidewall conductor adjacent the second half of the trench region is reduced to zero via etching.

* * * * *